(12) United States Patent
Bai et al.

(10) Patent No.: US 9,741,854 B2
(45) Date of Patent: Aug. 22, 2017

(54) METHOD FOR MANUFACTURING SEMICONDUCTOR DEVICE

(71) Applicant: Samsung Electronics Co., Ltd., Suwon-si (KR)

(72) Inventors: Keun Hee Bai, Suwon-si (KR); Kyoung Hwan Yeo, Seoul (KR); Seung Seok Ha, Hwaseong-si (KR); Seung Ju Park, Hwaseong-si (KR); Do Hyoung Kim, Hwaseong-si (KR); Myeong Cheol Kim, Suwon-si (KR); Jae Hyoung Koo, Yongin-si (KR); Ki Byung Park, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 37 days.

(21) Appl. No.: 14/959,457

(22) Filed: Dec. 4, 2015

(65) Prior Publication Data
US 2016/0181425 A1   Jun. 23, 2016

(30) Foreign Application Priority Data
Dec. 18, 2014   (KR) .................. 10-2014-0183490

(51) Int. Cl.
*H01L 21/336* (2006.01)
*H01L 29/78* (2006.01)
*H01L 29/66* (2006.01)
*H01L 29/165* (2006.01)

(52) U.S. Cl.
CPC .... *H01L 29/7848* (2013.01); *H01L 29/66545* (2013.01); *H01L 29/66818* (2013.01); *H01L 29/7851* (2013.01); *H01L 29/165* (2013.01)

(58) Field of Classification Search
None
See application file for complete search history.

(56) References Cited

U.S. PATENT DOCUMENTS

| | | | |
|---|---|---|---|
| 6,660,596 B2 | 12/2003 | Adkisson et al. | |
| 7,163,864 B1 | 1/2007 | Adkisson et al. | |
| 7,361,958 B2 | 4/2008 | Brask et al. | |
| 7,422,946 B2 | 9/2008 | Doyle et al. | |
| 7,737,501 B2 | 6/2010 | Zhu et al. | |
| 8,629,506 B2 | 1/2014 | Cheng et al. | |
| 8,697,523 B2 | 4/2014 | Cai et al. | |
| 8,741,722 B2 | 6/2014 | Chang et al. | |
| 2007/0155172 A1* | 7/2007 | Lai | H01L 27/2436 438/666 |

(Continued)

FOREIGN PATENT DOCUMENTS

JP   2011-009296 A   1/2011

*Primary Examiner* — Calvin Choi
(74) *Attorney, Agent, or Firm* — Muir Patent Law, PLLC

(57) ABSTRACT

There is provided a method for manufacturing a semiconductor device including a substrate including a plurality of active regions, a plurality of gate electrodes extending in a first direction to intersect a portion of the plurality of active regions, and including first and second gate electrodes disposed to be adjacent to each other in the first direction, a gate isolation portion disposed between the first and second gate electrodes. The gate isolation portion includes a first layer and second layers disposed on both ends of the first layer in a second direction perpendicular to the first direction.

20 Claims, 42 Drawing Sheets

(56) References Cited

U.S. PATENT DOCUMENTS

2008/0124893 A1* 5/2008 Kim .................... H01L 21/3081
                                                              438/426
2010/0124823 A1    5/2010 Yeh et al.
2013/0292777 A1   11/2013 Liaw
2014/0061780 A1*  3/2014 Son .................... H01L 21/28008
                                                              257/330

* cited by examiner

METHOD FOR MANUFACTURING SEMICONDUCTOR DEVICE

CROSS-REFERENCE TO RELATED APPLICATION

This application claims priority under 35 U.S.C. §119 to Korean Patent Application No. 10-2014-0183490 filed on Dec. 18, 2014, with the Korean Intellectual Property Office, the disclosure of which is incorporated herein by reference in its entirety.

BACKGROUND

The present disclosure relates to a semiconductor device, a method for forming a pattern of a semiconductor device, and a method for manufacturing a semiconductor device.

With demand for semiconductor devices supporting high performance, high speeds, and/or multiple functions increasing, degrees of integration of semiconductor devices have increased. In manufacturing semiconductor devices having fine patterns to meet the need for high integration in semiconductor devices, it is useful to form patterns with fine widths and fine spaces therebetween. Also, efforts to develop semiconductor devices including a fin field effect transistor (FinFET) having a channel having a three-dimensional structure have been made to help overcome limitations in device characteristics of planar metal oxide semiconductors (MOSFETs).

SUMMARY

Certain aspects of the present inventive concept may provide a semiconductor device having an enhanced degree of integration, a method for forming a pattern of a semiconductor device, and a method for manufacturing a semiconductor device.

According to certain aspects of the present inventive concept, a semiconductor device may include a substrate including a plurality of active regions, a plurality of gate electrodes extending in a first direction to intersect a portion of the plurality of active regions, and including first and second gate electrodes disposed adjacent to each other to form a row in the first direction, and a gate isolation portion disposed between the first and second gate electrodes, wherein the gate isolation portion includes a first layer and a second layer stacked with each other in a second direction perpendicular to the first direction.

Both side surfaces of the gate isolation portion in the second direction may be coplanar with side surfaces of the first and second gate electrodes.

A width of the second layer in the second direction may be smaller than that of the first layer.

The first layer and the second layer may be formed of materials each having a different etch selectivity with respect to a predetermined etchant.

The first layer may include a silicon nitride, and the second layer may include a silicon oxide.

The gate isolation portion may have a length equal to or smaller than 50 nm in the first direction.

The plurality of active regions may be provided as active pins each having an upper surface and opposite side surfaces, and the plurality of gate electrodes may cover the upper surfaces and opposite side surfaces of the active fins and intersecting the active fins.

The plurality of active regions may include recessed regions on both sides of the plurality of gate electrodes, and source and drain regions may be disposed in the recessed regions.

The source and drain regions may be formed of a silicon germanium (SiGe) epitaxial layer.

Both ends of the gate isolation portion may have different lengths in the second direction.

According to certain aspects of the present inventive concept, a method for manufacturing a semiconductor device may include forming a structure including a sacrificial pattern layer on a substrate, the sacrificial pattern layer having a line shape extending in a first direction and including first and second parts, forming a mask layer exposing the first part of the sacrificial pattern layer, removing the first part of the sacrificial pattern layer exposed by the mask layer to form an opening in the structure, forming a first layer of a pattern isolation portion covering at least a portion of an inner wall of the opening including a side surface of the second part exposed through the opening, forming a second layer of the pattern isolation portion filling the opening, removing the second part of the sacrificial pattern layer, removing at least a portion of the first layer exposed by removing the second part of the sacrificial pattern layer, and forming a conductive pattern layer in a region formed by removing the second part of the sacrificial pattern layer and the portion of the first layer.

The first and second parts of the sacrificial pattern layer may be alternately disposed in the first direction, and the sacrificial pattern layer may be cut by removing the first part of the sacrificial pattern layer.

The conductive pattern layer may extend in the first direction and include patterns disposed to be spaced apart from one another in the first direction.

In the forming of the first layer, the first layer may be formed on the entirety of an inner sidewall of the opening.

The first layer may be formed by atomic layer deposition (ALD).

In the forming the first layer, the first layer may be formed only on side surfaces of the second part of the sacrificial pattern layer exposed by the opening.

The first layer may be formed by oxidizing a portion of the second part of the sacrificial pattern layer.

In the removing of at least the portion of the first layer, the first layer may be selectively removed with respect to the second layer.

In the removing of at least a portion of the first layer, a region of the first layer formed on a side surface of the second layer in a second direction perpendicular to the first direction may not be removed, but remained.

The second layer may include an upper layer and a lower layer formed of different materials.

The structure may include a plurality of sacrificial pattern layers spaced apart from one another by a predetermined distance and insulating layers filling spaces between the sacrificial pattern layers.

At least one open region exposing a plurality of first regions in a direction perpendicular to the first direction may be formed in the mask layer.

According to certain aspects of the present inventive concept, a method for manufacturing a semiconductor device may include forming a linear sacrificial pattern layer extending in a first direction on a substrate, removing a first part of the sacrificial pattern layer to form an opening, filling the opening to form a pattern isolation portion, removing a second part of the sacrificial pattern layer that includes the remaining sacrificial pattern layer, and forming conductive pattern layers extending in the first direction on both sides of the pattern isolation portion.

The pattern isolation portion may include two layers formed of different respective materials.

The two layers may be stacked vertically on the substrate.

The forming of the pattern isolation portion may include: forming a first layer on side surfaces of the sacrificial layer exposed by the opening, and forming a second layer filling the opening.

The method may further include removing at least a portion of the first layer exposed by removing the second part of the sacrificial pattern layer, before the forming of the conductive pattern layers.

According to certain aspects of the present inventive concept, a method for manufacturing a semiconductor device may include forming an isolation layer defining a plurality of active regions on a substrate, forming a plurality of linear sacrificial pattern layers intersecting the plurality of active regions and extending in a first direction, forming a mask layer having an open region exposing a portion of the plurality of sacrificial pattern layers and extending in a second direction different from the first direction on the plurality of sacrificial pattern layers, removing a portion of the plurality of sacrificial pattern layers exposed through the open region to form an opening, forming a first layer of a gate isolation portion on side surfaces of the plurality of sacrificial pattern layers exposed through the opening, forming a second layer of the gate isolation portion to fill the opening, removing the plurality of remained sacrificial pattern layers, removing at least a portion of the first layer exposed by removing the plurality of sacrificial pattern layers, and forming gate electrodes on both sides of the second layer.

The open region may have a rectangular shape or an elongated shape, and the plurality of sacrificial pattern layers may be exposed through the single opening region.

The gate electrodes may be electrically and physically separated from the second layer.

According to certain aspects of the present inventive concept, a method for manufacturing a semiconductor device may include forming a sacrificial layer extending in a first direction on a first insulating layer, removing a first part of the sacrificial layer to form an opening region, forming a first layer to cover at least entire sidewall surfaces of the sacrificial layer in the opening region to fill a first portion of the opening region, forming a second layer filling a second portion of the opening region to form an isolation portion, removing a second part of the sacrificial layer that includes the remaining sacrificial layer, after removing the second part of the sacrificial layer, removing at least a first portion of the first layer, and forming a third layer on the removed portion of the sacrificial layer and the removed first portion of the first layer, the third layer extending in the first direction on both sides of the isolation portion.

BRIEF DESCRIPTION OF DRAWINGS

The above and other aspects, features and advantages of the present inventive concept will be more clearly understood from the following detailed description taken in conjunction with the accompanying drawings, in which:

FIGS. 2A through 9A and 2B through 9B are plan views and cross-sectional views illustrating sequential processes of a method for forming a pattern of a semiconductor device according to example embodiments of the present inventive concept;

DETAILED DESCRIPTION

Figure 1:
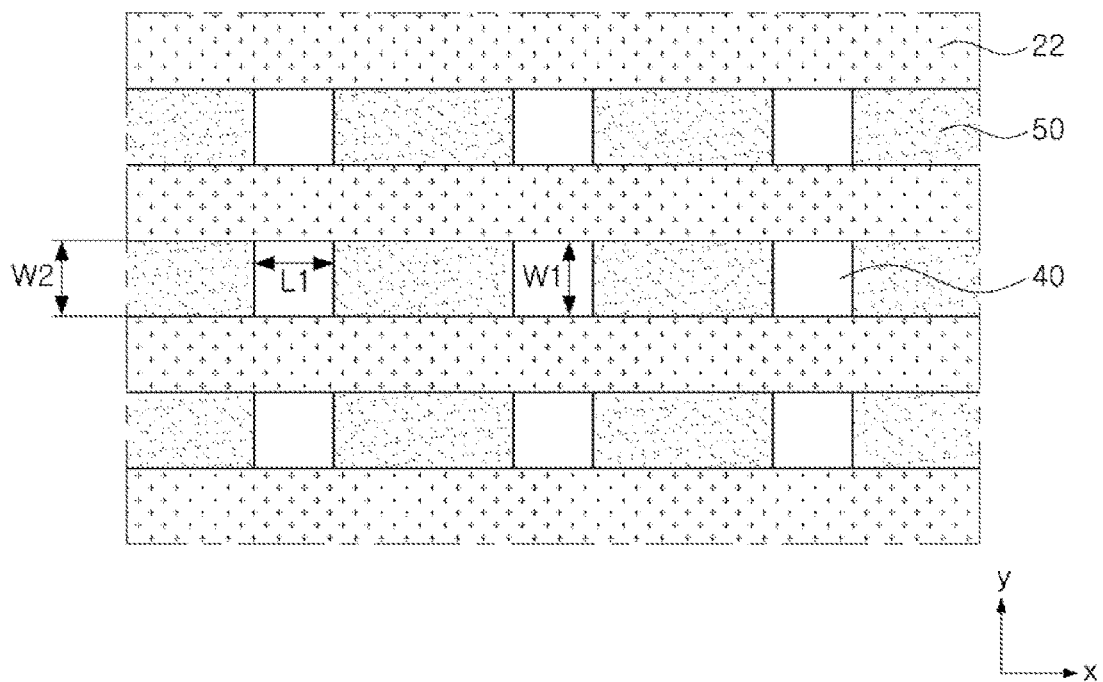
FIG. 1 is a plan view illustrating a semiconductor device that may be realized by applying a method for forming a pattern of a semiconductor device according to example embodiments of the present inventive concept.

Example embodiments of the present inventive concept will now be described in detail with reference to the accompanying drawings.

The inventive concept may, however, be exemplified in many different forms and should not be construed as being limited to the specific embodiments set forth herein. In the drawings, the shapes and dimensions of elements may be exaggerated for clarity, and the same reference numerals will be used throughout to designate the same or like elements.

The terminology used herein is used for the purpose of describing particular embodiments only and is not intended to be limiting of the inventive concept. Also, as used herein, singular forms "a", "an" and "the" are intended to include the plural forms as well, unless the context clearly indicates otherwise. Expressions such as "at least one of," when preceding a list of elements, modify the entire list of elements and do not modify the individual elements of the list. It will be understood that when an element is referred to as being "connected" or "coupled" to another element, it may be directly connected or coupled to the other element or intervening elements may be present. The term "contact," as used herein, refers to a direct contact, unless indicated otherwise.

It will be understood that when an element such as a layer, region or substrate is referred to as being "on" another element, it can be directly on the other element or intervening elements may be present. In contrast, the term "directly" means that there are no intervening elements. It will be further understood that terms such as "comprises," "comprising," "includes," "including," and/or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added. Terms "and/or" include any one or all of one or more combinations of corresponding enumerated items.

Unless the context indicates otherwise, terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Additionally, the embodiments in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

Also, though terms like "first" and "second" may be used to describe various members, components, regions, layers, and/or portions in various embodiments of the present invention, the members, components, regions, layers, and/or portions are not limited to these terms. Unless indicated otherwise, these terms are used only to differentiate one member, component, region, layer, or portion from others thereof. Therefore, a member, a component, a region, a layer, or a portion referred to as a first member, a first component, a first region, a first layer, or a first portion in an embodiment may be referred to as a second member, a second component, a second region, a second layer, or a second portion without departing from the scope of the present invention. Claims may use the terms "first," "second," etc., to describe elements in the claims whether or not those elements are described using these terms in the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating a semiconductor device that may be realized by applying a method for forming a pattern of a semiconductor device according to example embodiments of the present inventive concept.

Referring to FIG. 1, a semiconductor device 10 may include pattern layers 50, pattern isolation portions 40 isolating the pattern layers 50 by a predetermined length, and insulating layers 22.

The pattern layers 50 may have a shape such as a rectangular shape, an elongated shape, an oval shape, or the like, extending in an x direction of FIG. 1. The pattern layers 50 may be separated from other pattern layers 50 adjacent thereto in the x direction by the pattern isolation portions 40. The side surfaces of the pattern isolation portions 40 may be coplanar with the pattern layers 50 in the y direction. Accordingly, the pattern isolation portions 40 and the pattern layers 50 may form a line extending in the x direction. The insulating layers 22 may be disposed between the pattern isolation layers 40 and the pattern layers 50 in the y direction of FIG. 1.

The pattern isolation layers 40 have a first length L1 in the x direction and have a first width W1 in the y direction. The first length L1 may be less than about 50 nm, for example, may range from 10 nm to 40 nm. The first width W1 may be substantially equal to a second width W2 of the pattern layers 50.

The pattern layers 50 may form gate electrode layers of a transistor of the semiconductor device 10. For example, the pattern layers 50 may be formed of a conductive material such as polysilicon or metal. The pattern isolation portions 40 and the insulating layer 22 may be formed of an insulating material such as a silicon oxide or a silicon nitride. However, purposes and materials of the pattern layers 50, the pattern isolation portions 40, and the insulating layers 22 may be vary according to semiconductor devices to which they are applied.

The semiconductor device 10 may form part of a memory device or a logic device. For example, the memory device may be a volatile memory device such as a dynamic random access memory (DRAM) or static random access memory (SRAM) or a non-volatile memory device such as a flash memory, or the like. The logic device may be a microprocessor, and may be, for example, a central processing unit (CPU), a controller, or an application specific integrated circuit (ASIC).

Also, as used herein, a semiconductor device may refer to various items such as a memory device, one or more logic devices or memory cells formed in or on a semiconductor substrate, a semiconductor chip, a memory chip, a memory die, a logic chip, a package, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages. A semiconductor device may include one or more transistors such as metal oxide semiconductor field effect transistors (MOSFETs) or fin field effect transistors (FinFETs), or an array of memory cells.

An electronic device, as used herein, may refer to one of these devices and may also include products that include these devices, such as a memory card, a memory module, a hard drive including additional components, a mobile phone, laptop, tablet, desktop, camera, server, or other consumer electronic device.

FIGS. 2A through 9B are plan views and cross-sectional views illustrating sequential processes of a method for forming a pattern of a semiconductor device according to example embodiments of the present inventive concept.

Figure 2A:
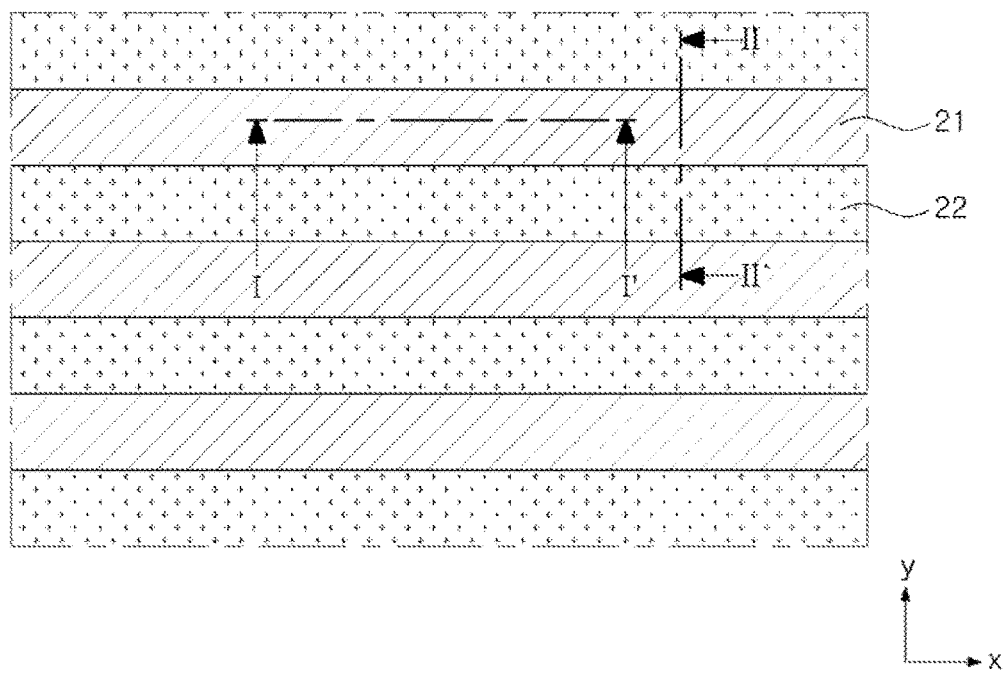
Figure 2B:
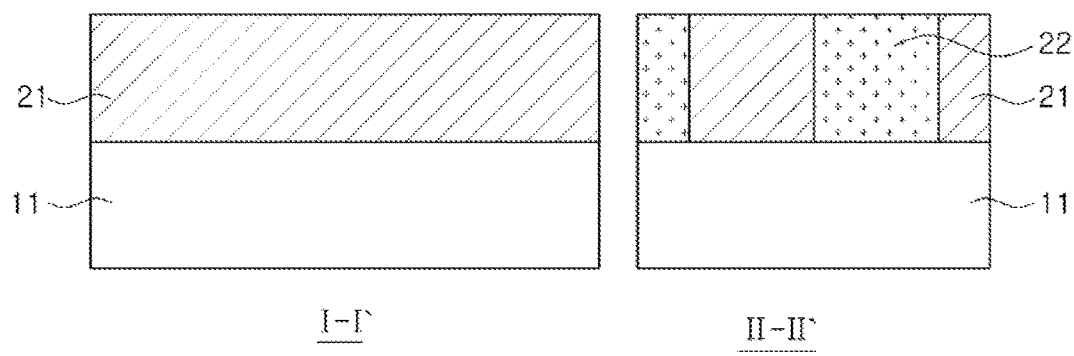

FIG. 2A is a plan view illustrating a region corresponding to FIG. 1, and FIG. 2B includes cross-sectional views taken along lines I-I' and II-II'. FIGS. 3A through 9B are illustrated in the same manner.

Referring to FIGS. 2A and 2B, linear sacrificial layers 21 (e.g., sacrificial pattern layers 21) and insulating layers 22 extending in the x direction may be alternately formed on a substrate 11 in the y direction. The substrate 11 may be a semiconductor substrate (e.g., a silicon wafer), or may be a semiconductor wafer on which a part of a semiconductor device is formed. In some embodiments, the substrate 11 may include an insulating layer on the semiconductor substrate. The insulating layer may be one of layers formed during a semiconductor device manufacturing process (e.g., a gate insulating layer 152 of FIG. 11), an oxide, a nitride, and an oxynitride.

The sacrificial pattern layers 21 may be first patterned on the substrate 11, and the insulating layers 22 may be formed to fill spaces between the sacrificial pattern layers 21. The sacrificial pattern layers 21 are layers for forming the pattern layers 50 of FIG. 1 through a follow-up process, which may be removed during a follow-up process. The sacrificial pattern layers 21 and the insulating layers 22 may be formed through a process such as atomic layer deposition (ALD) or chemical vapor deposition (CVD). Also, after a material of the insulating layers 22 is deposited, a chemical mechanical polishing (CMP) process may be performed for planarization.

By forming the insulating layers 22, the structure of the sacrificial pattern layers 21 and the insulating layers 22 having a flat upper surface may be formed. Accordingly, a follow-up process, for example, a photolithography process, may be easily performed. However, in an example embodiment, the process of forming the insulating layers 22 may be omitted.

The sacrificial pattern layers 21 and the insulating layers 22 may be formed of materials each having a different etch selectivity. Such an etch selectivity may be quantitatively expressed through a ratio of an etch rate of other layer to an etch rate of one layer under particular etching conditions. For example, the sacrificial pattern layers 21 and the insulating layers 22 may be formed of at least one among a silicon-contained material such as a silicon dioxide ($SiO_2$), a silicon oxynitride (SiON), a silicon nitride ($Si_3N_4$), and a polysilicon, or a metal.

Figure 3A:
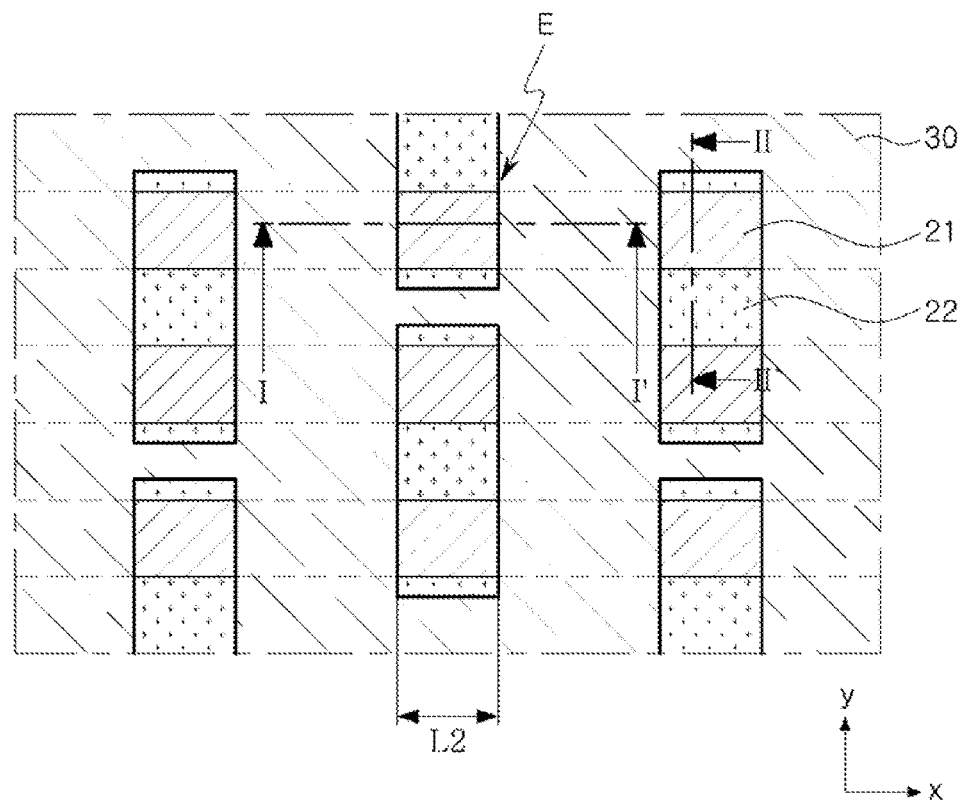
Figure 3B:
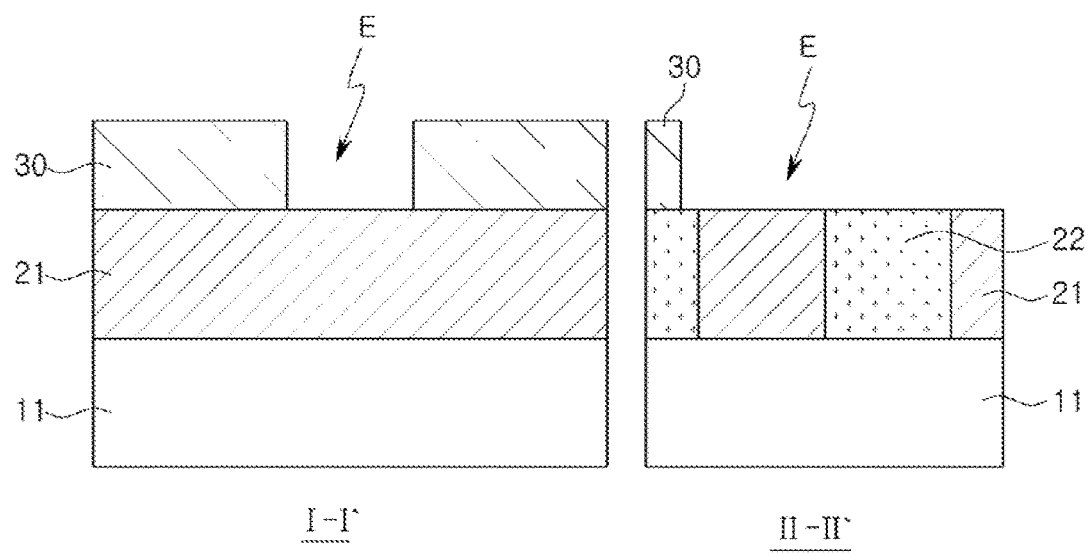

Referring to FIGS. 3A and 3B, a mask layer 30 exposing partial regions of the sacrificial pattern layers 21 and the insulating layers 22 may be formed on the structure of the sacrificial pattern layers 21 and the insulating layers 22.

The mask layer 30 may have an exposed region E, and partial regions of the sacrificial pattern layers 21 and the insulating layers 22 may be exposed. The exposed partial regions may be regions including the sacrificial pattern layers 21 in a region having a greater length in the x direction, compared with a region in which the pattern isolation portions 40 of FIG. 1 are formed, and including portions of the insulating layers 22 on the sides of the sacrificial pattern layers 21 in the y direction. Thus, a length L2 of the exposed region E in the x direction may be greater than the first length L1 of the pattern isolation portion 40 of FIG. 1.

Two sacrificial pattern layers 21 may be exposed through a single exposed region E, but the present inventive concept is not limited thereto. Each of the exposed regions E is illustrated as having a rectangular shape, but it may also have a shape such as a rounded rectangular shape or an oval shape. Also, as illustrated, the exposed regions E may be disposed to be shifted each other in adjacent columns, or may be disposed to form columns and rows in the x direction and y direction. For example, in example embodiments, the size, shape, and disposition of the exposed regions E may be varied.

Figure 4A:
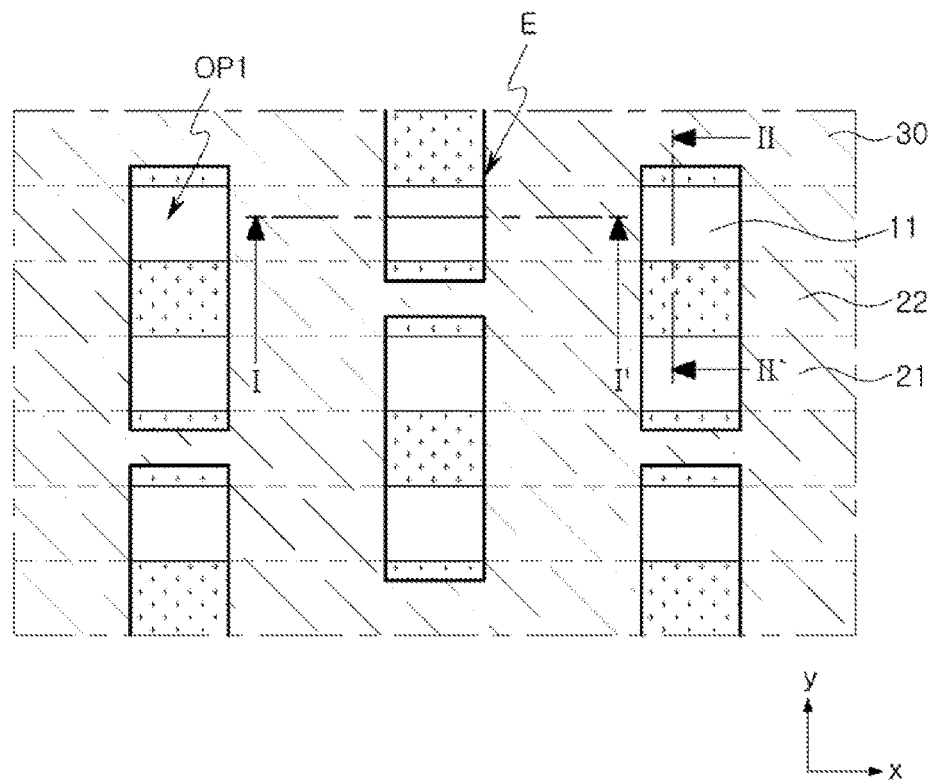
Figure 4B:
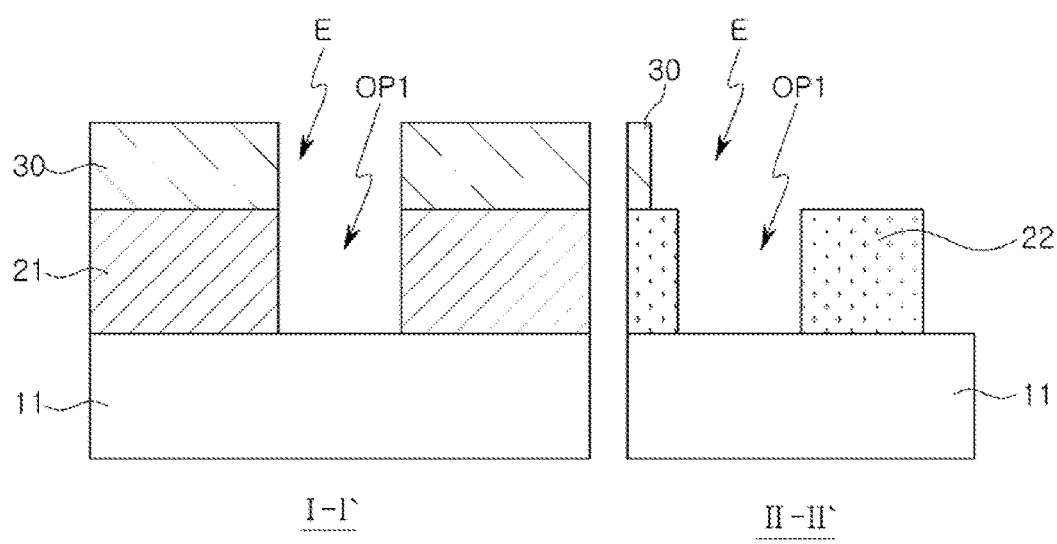

Referring to FIGS. 4A and 4B, the sacrificial pattern layers 21 exposed through the exposed region E of the mask layer 30 may be removed.

Among the sacrificial pattern layers 21 and the insulating layers 22 exposed through the exposed regions E, the sacrificial pattern layers 21 may be selectively removed. The sacrificial pattern layers 21 may be selectively removed through wet etching or dry etching to expose the substrate 11 therebelow. For example, a first part of each of the sacrificial pattern layers may be removed. Accordingly, the sacrificial pattern layers 21 may be cut into units having a predetermined length, and first openings OP1 each having a hole shape may be formed in regions from which the sacrificial pattern layers 21 were removed.

Figure 5A:
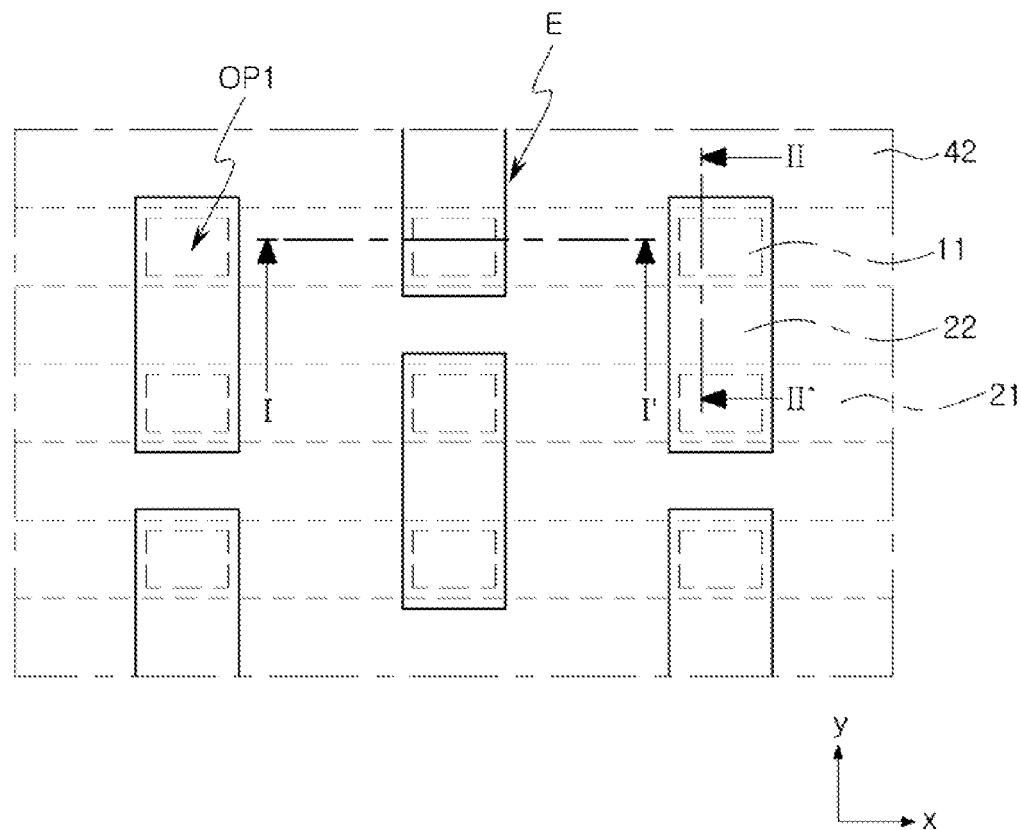
Figure 5B:
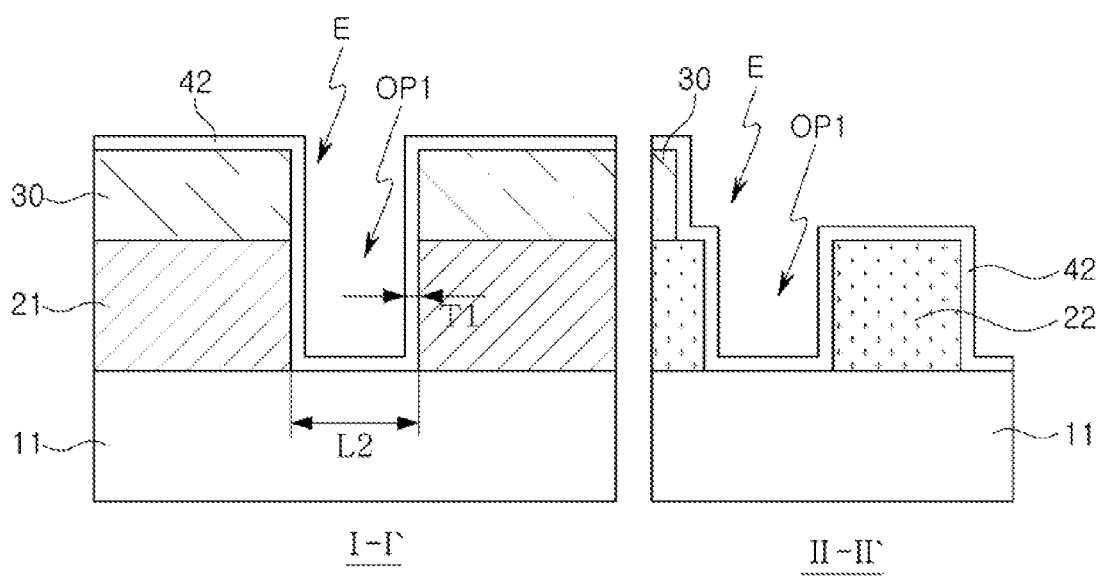

Referring to FIGS. 5A and 5B, a first layer 42 of the pattern isolation portion 40 (refer to FIG. 1) covering sidewalls of the sacrificial pattern layers 21 and the insulating layers 22 exposed through the first openings OP1 may be formed.

A first thickness T1, a thickness of the first layer 42, may be, for example, equal to or less than 100 Å, and the first layer 42 may be formed by ALD. The first thickness T1 may be determined in consideration of the first length L1 (refer to FIG. 1), a size of the pattern isolation portion 40 to be formed eventually. For example, the first thickness T1 may correspond to a half of the difference between the second length L2 of the exposed region E of the mask layer 30 and the first length L1.

In an example embodiment, the first layer 42 may be formed by oxidizing a portion of the sacrificial pattern layer 21 exposed through the first opening OP1. For example, the insulating layers 22 may not be oxidized and the first layer 42 may be formed only on the sidewalls of the first opening OP1 in the x direction.

Figure 6A:
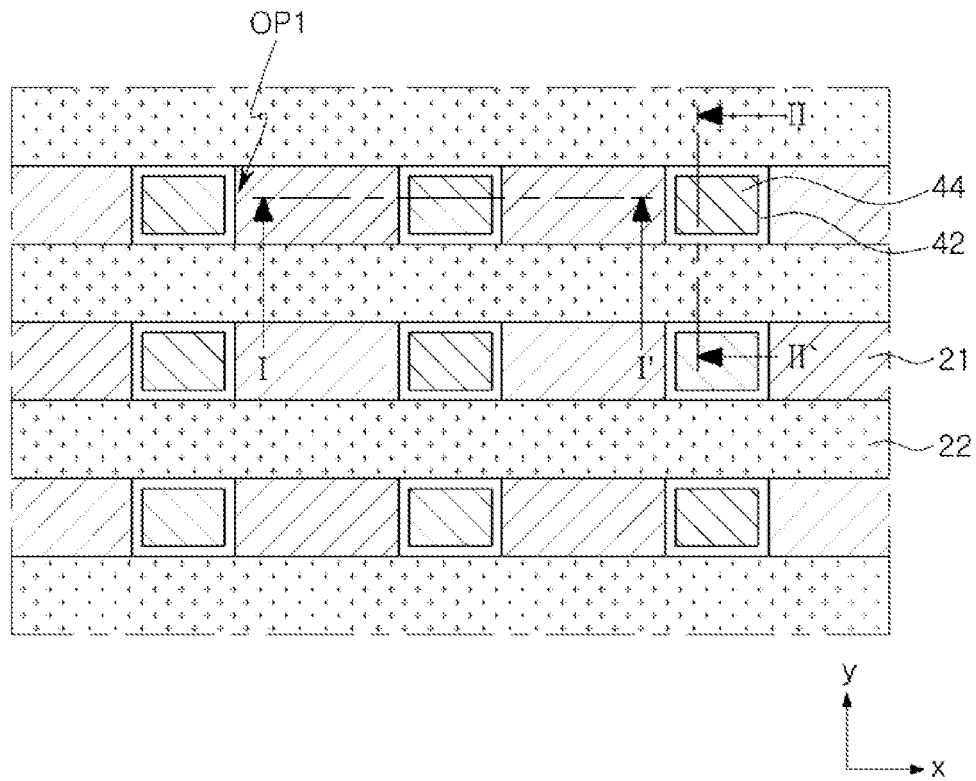
Figure 6B:
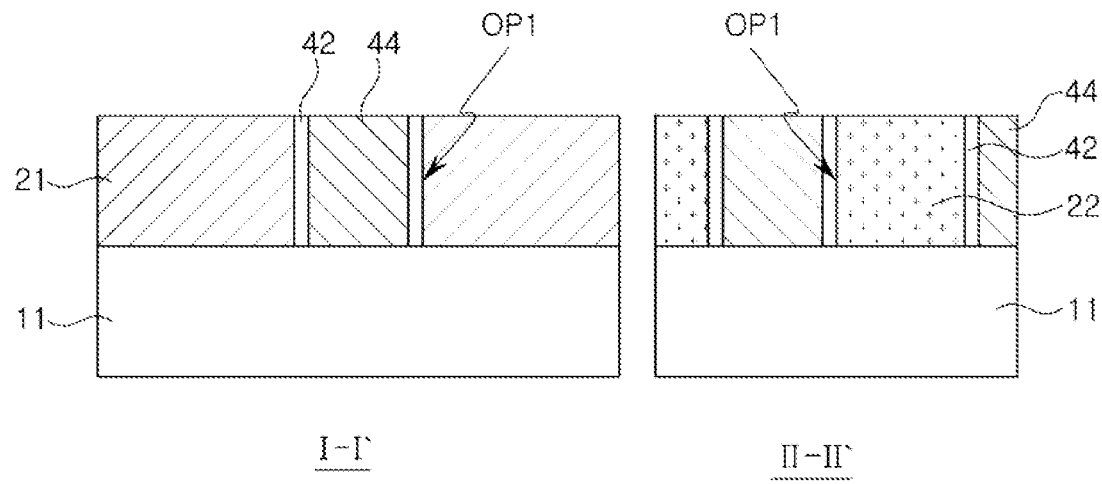

Referring to FIGS. 6A and 6B, a second layer 44 of the pattern isolation portion 40, filling the first opening OP1, may be formed.

Before the formation of the second layer 44, a process of removing the first layer 42 from an upper surface of the substrate 11 exposed by the first opening OP1 may be performed. However, such a process may be optional and may be omitted according to example embodiments, and the first layer 42 may be remained on the substrate 11 within the first opening OP1.

After the first opening OP1 is filled by depositing a material forming the second layer 44, the mask layer 30 may be removed and a planarization process may be performed. According to example embodiments, the second layer 44 may be formed as a single layer or may be formed as multiple layers including a plurality of stacked layers. For example, the stacked layers of the second layer 44 may include different materials.

Figure 7A:
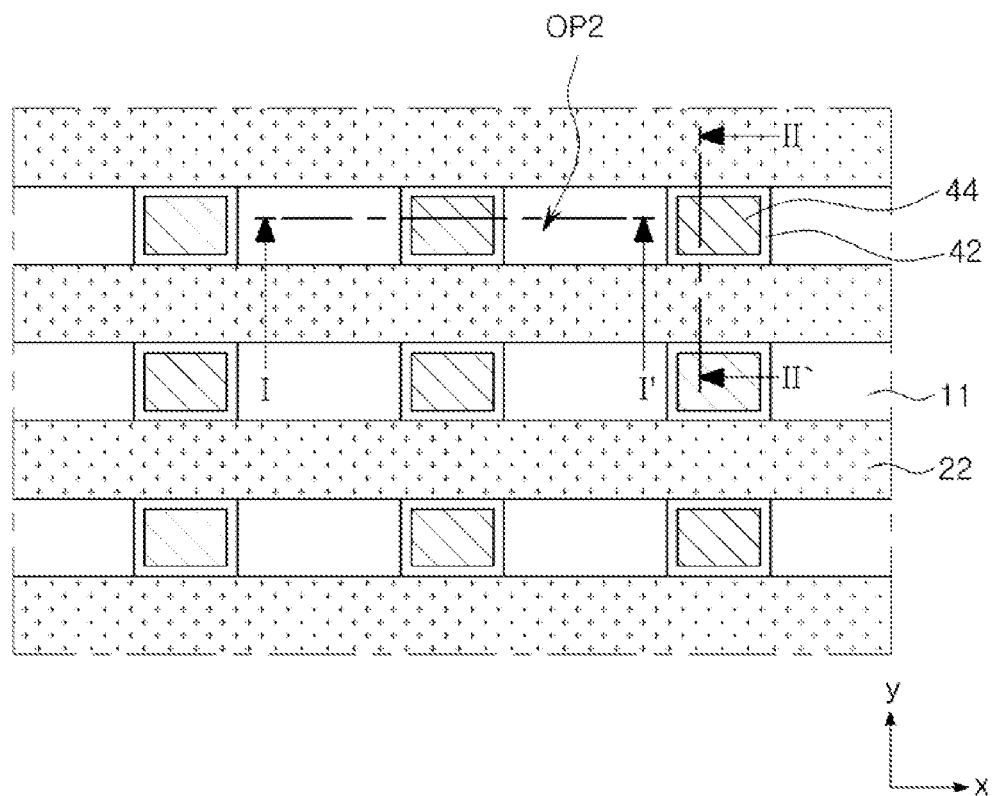
Figure 7B:
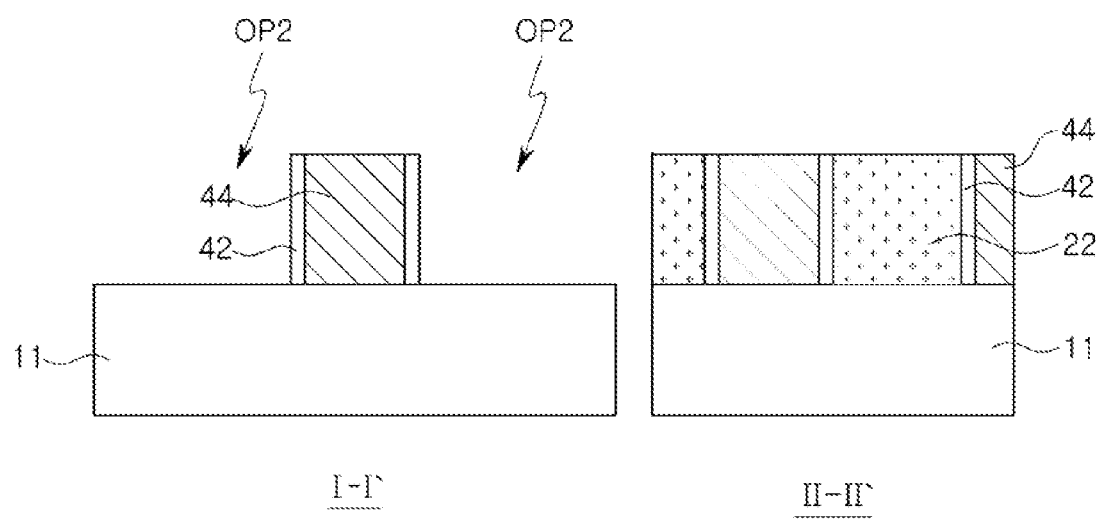

Referring to FIGS. 7A and 7B, the retained sacrificial pattern layers 21 may be removed.

The sacrificial pattern layers 21 remained on both sides of the first layer 42 are selectively removed with respect to the first and second layers 42 and 44 and the insulating layer 22 such that the substrate 11 therebelow is exposed, and accordingly, a second opening OP2 may be formed. For example, a second part of the sacrificial pattern layers 21, which includes the remaining sacrificial pattern layer 21, may be removed.

The process of removing the sacrificial pattern layers 21 may be performed using at least one of a dry etching process or a wet etching process. For example, the sacrificial pattern layer 21 may be removed by performing the dry etching process first and subsequently performing the wet etching process.

Figure 8A:
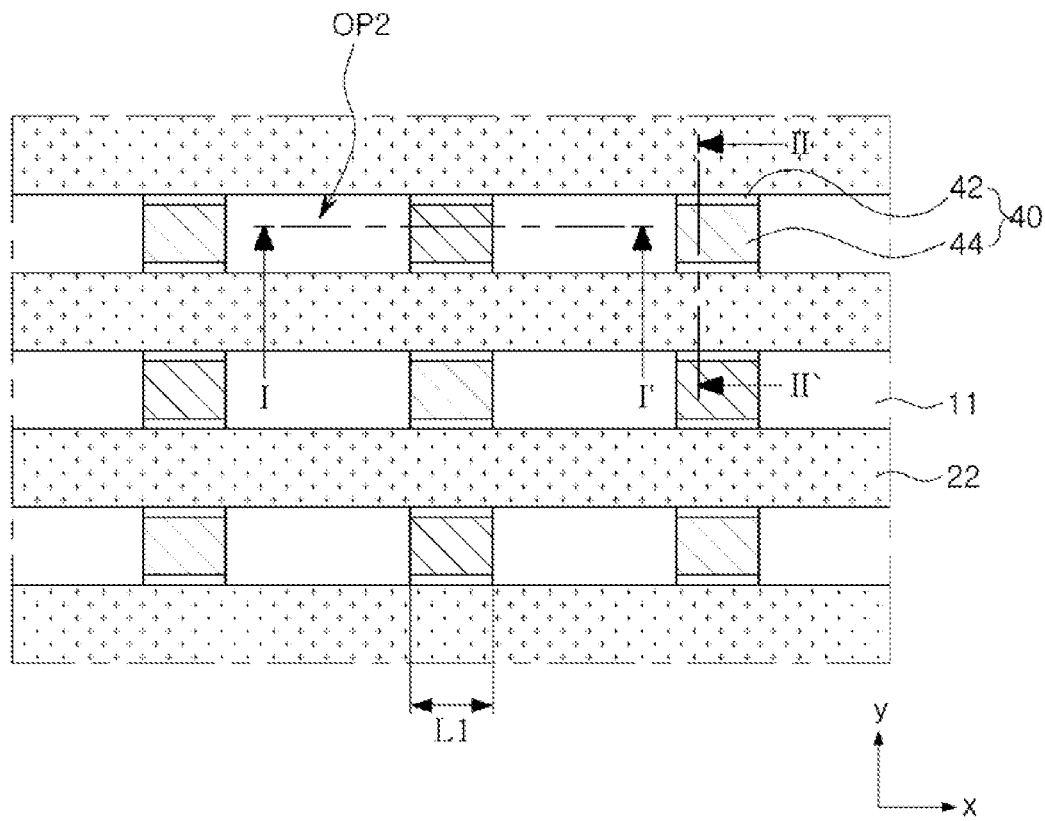
Figure 8B:
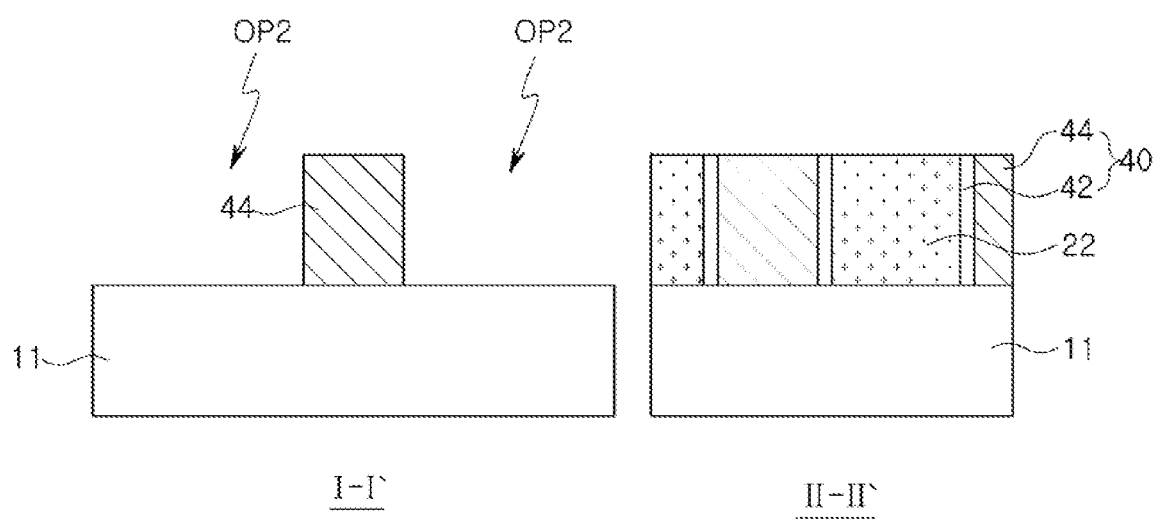

Referring to FIGS. 8A and 8B, a portion of the first layer 42 exposed through the second opening OP2 may be removed.

In detail, the first layer 42 formed on both sidewalls of the second layer 44 in the x direction may be removed. As the process of removing a portion of the first layer 42, for example, a wet etching process may be used. In one embodiment, the first layer 42 may be selectively etched with respect to the second layer 44, and a process of etching only the first layer 42 disposed on the sidewall surfaces of the second layer 44 may be performed by adjusting an etch time with the etch selectivity process. The first layer 42 may only remain on sidewalls of the second layer 44 in the y direction, and the remaining first layer 42 may form the pattern isolation portion 40 together with the second layer 44. For example, when an etching process which removes the first layer 42 disposed on the sidewalls of the second layer 44 in the x direction is performed, the first layer 42 disposed on the sidewalls of the second layer 44 in the y direction may not be removed by a mask layer. As such, the first layer 42 in the x direction may be removed such that the pattern isolation portion 40 may have the first length L1 of FIG. 1 in the x direction.

A length of the second opening OP2 may extend in the x direction by this removing process. In an example embodiment, a portion of the second layer 44 may also be consumed, and accordingly, a height of the second layer 44 may be reduced.

Figure 9A:
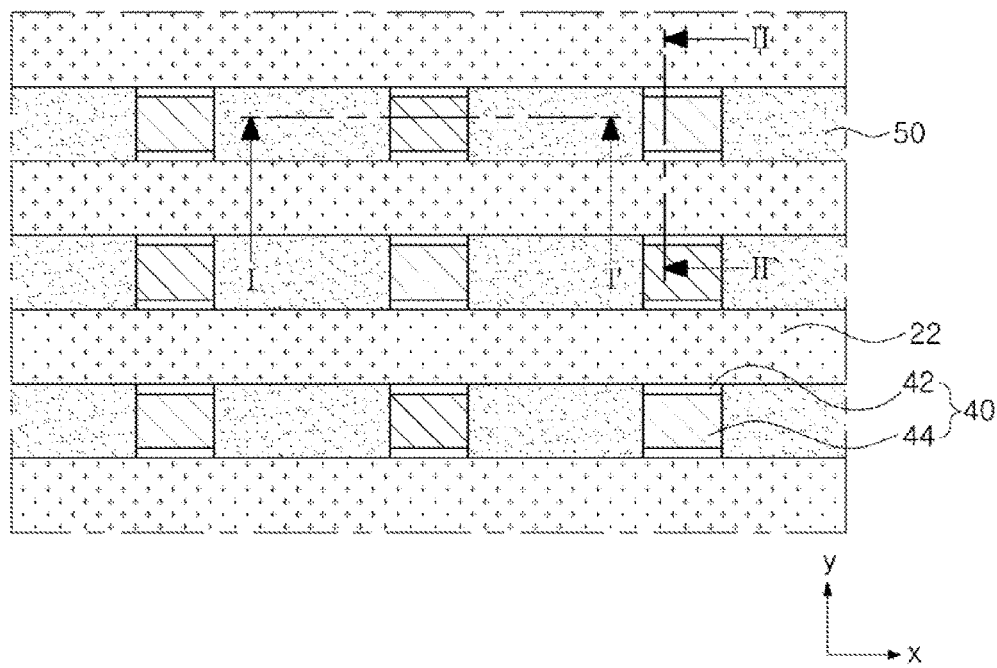
Figure 9B:
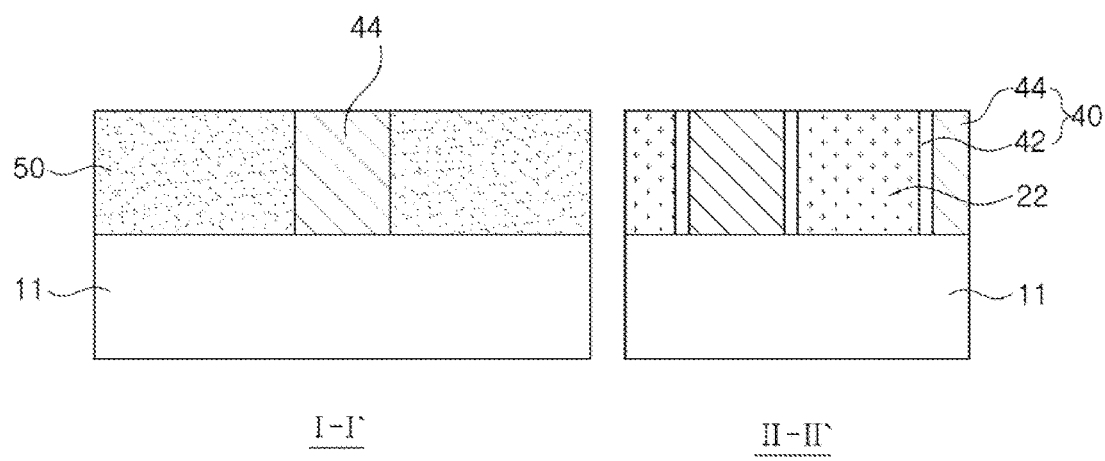

Referring to FIGS. 9A and 9B, a process of forming the pattern layers 50 in the second opening OP2 may be performed.

The pattern layers 50 may be formed by depositing a material for forming the pattern layers 50 within the second opening OP2 and performing a planarization process thereon, if necessary. The pattern layers 50 may be disposed to be spaced apart from one another by a predetermined length by the pattern isolation portions 40 in the x direction. The pattern layers 50 may be formed of conductive material.

According to the method for forming a pattern of a semiconductor device described above with reference to FIGS. 2A through 9B, the pattern isolation portions 40 including the first and second layers 42 and 44 may be formed. The example embodiments for the pattern isolation portions 40 of FIG. 1, and the configuration of layers forming the pattern isolation portions 40 may be variously modified. For example, in an example embodiment, the pattern isolation portions 40 may be formed as a monolayer. For example, the process of forming the first layer 42 described above with reference to FIGS. 5A and 5B may be omitted and the process of removing a portion of the second layer 44, instead of the process of removing a portion of the first layer 42, described above with reference to FIGS. 8A and 8B, may be performed to form the pattern isolation portions 40.

In example embodiment, since the pattern layers 50 are formed using the pattern isolation portions 40, the pattern layers 50 may be formed with high density. Also, since the pattern isolation portions 40 include the first and second layers 42 and 44 and a portion of the first layer 42 is removed, the first length L1 (refer to FIG. 1) may be more reduced comparing with simply patterning through photolithography.

Figure 10A:
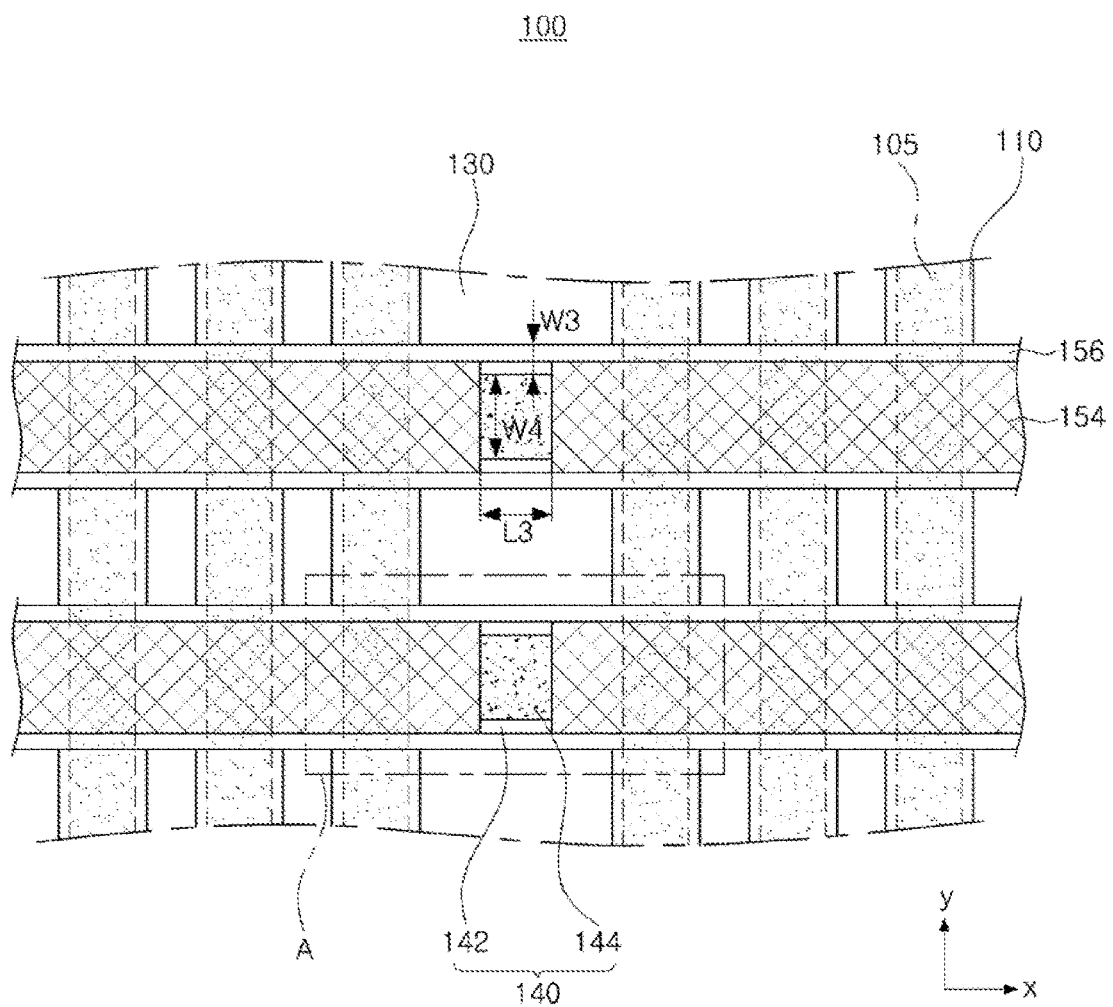
FIGS. 10A, 10B, and 11 are plan views and a perspective view illustrating a semiconductor device that may be realized by applying a method for forming a pattern of a semiconductor device according to example embodiments of the present inventive concept.
Figure 10B:
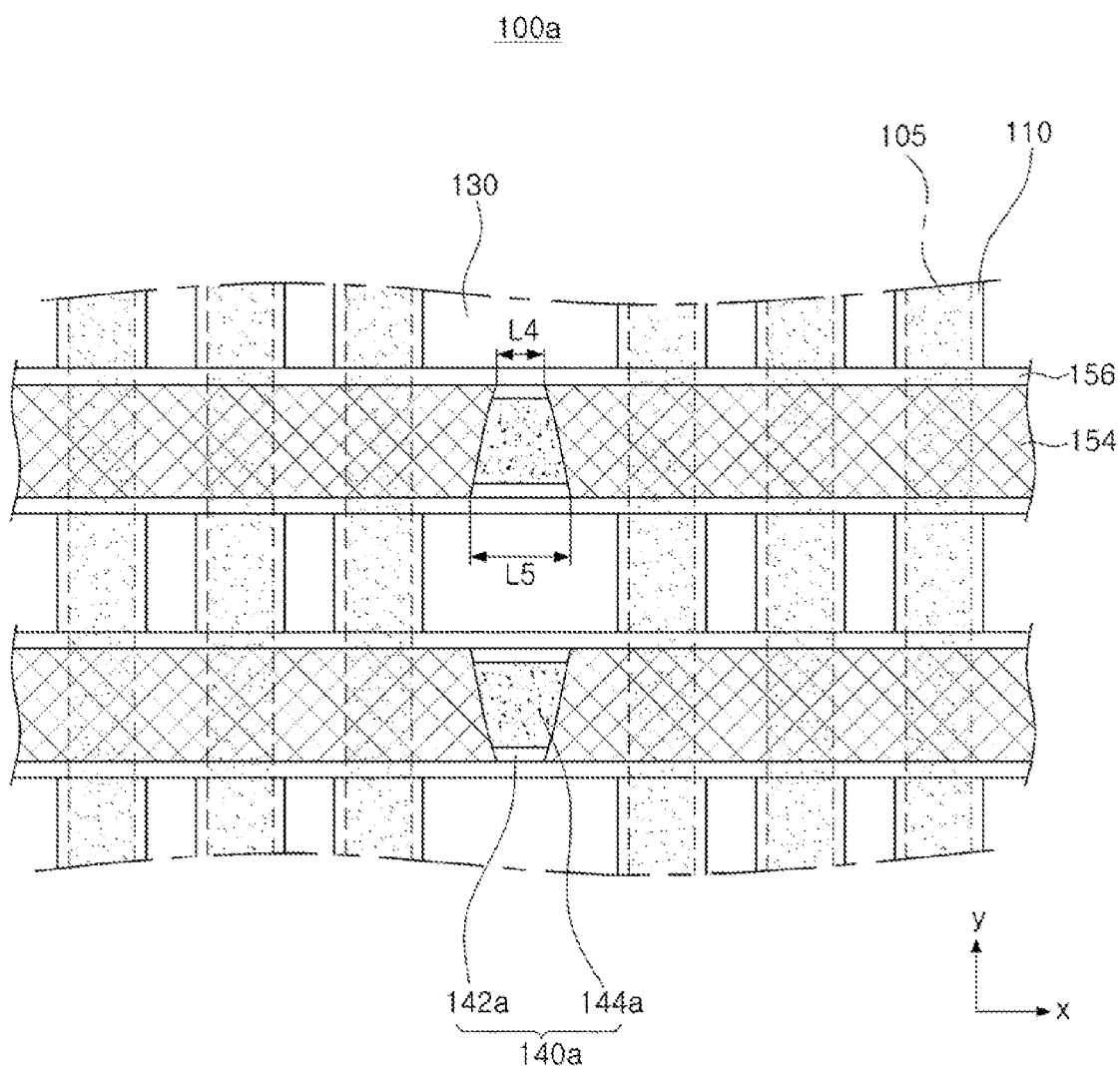
Figure 11:
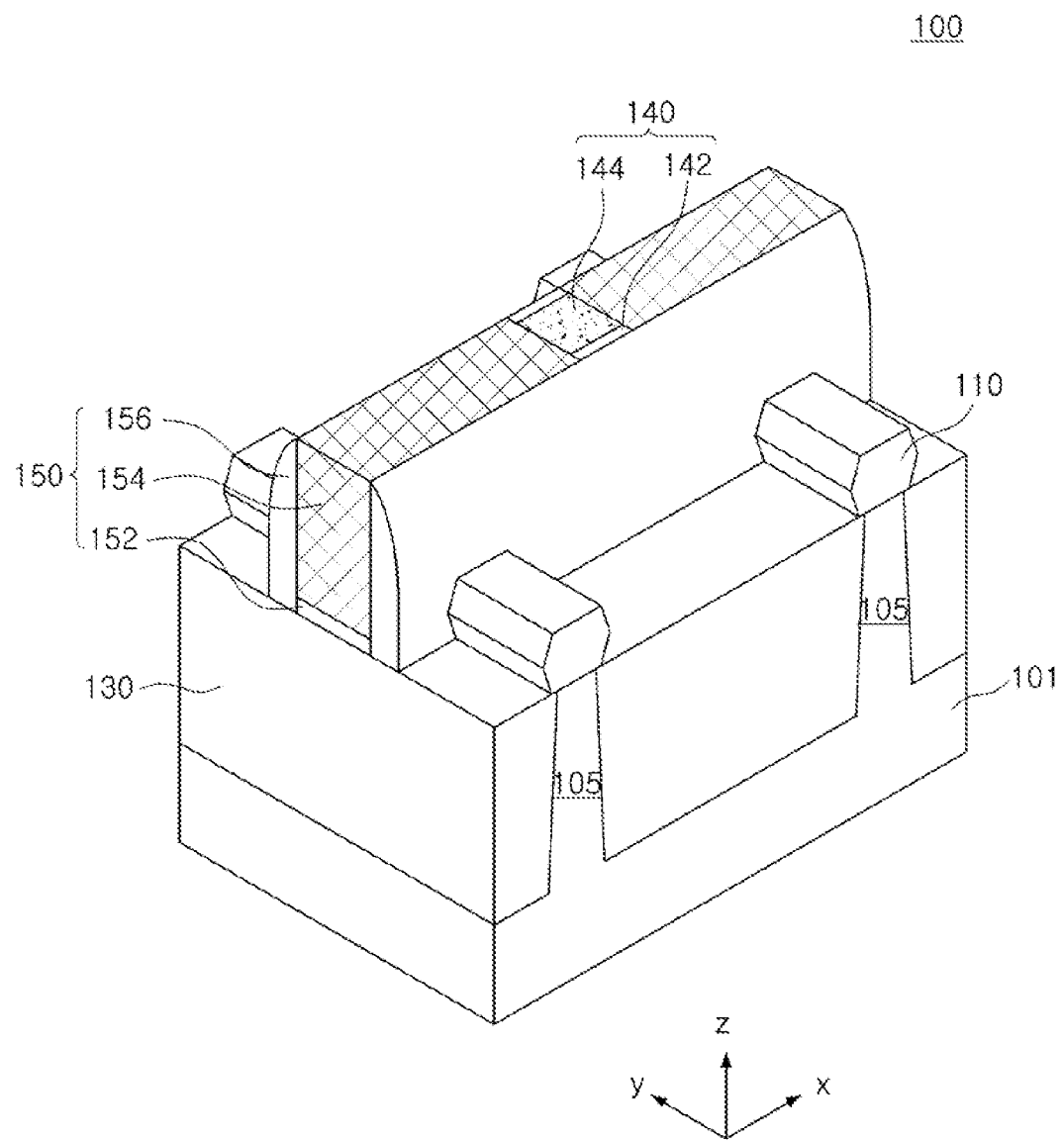

FIGS. 10A through 11 are plan views and a perspective view illustrating a semiconductor device that may be realized by applying a method for forming a pattern of a semiconductor device according to example embodiments of the present inventive concept. FIG. 11 illustrates a portion corresponding to region 'A' of FIG. 10A.

Referring to FIGS. 10A and 11, a semiconductor device 100 may include a substrate 101, active regions 105 extending in a second direction, for example, in the y direction, on the substrate 101, a gate structure 150 including gate electrodes 154 extending in a first direction, for example, in the x direction, on the active regions 105, a gate isolation portion 140 disposed between the gate electrodes 154 in the x direction. Also, the semiconductor device 100 may further include isolation layers 130 defining the active regions 105 and epitaxial layers 110 positioned on the active regions 105 on the sides of the gate electrodes 154. In FIGS. 10A, 10B, and 11, some components, for example, an interlayer insulating layer 160 (refer to FIG. 29), is omitted to help understand the present inventive concept.

The semiconductor device 100 according to the present example embodiment may be a transistor (FinFET) having a fin structure.

The substrate 101 may have an upper surface extending in the x direction and the y direction. The substrate 101 may include a semiconductor material, for example, a Group IV semiconductor, a Group III-V compound semiconductor, or a Group II-VI oxide semiconductor. For example, the Group IV semiconductor may include silicon, germanium, or silicon-germanium. The substrate 101 may be provided as a bulk wafer, an epitaxial layer, a silicon-on-insulator (SOI) layer, or a semiconductor-on-insulator (SeOI) layer.

The isolation layers 130 may be formed of an insulating material. The isolation layers 130 may be formed by, for example, a shallow trench isolation (STI) process. The isolation layers 130 may be formed of, for example, an oxide, a nitride, or a combination thereof.

The active regions 105 may be defined by the isolation layers 130 within the substrate 101, and may have a structure of active fins protruding from the substrate 101 in a z direction. In one embodiment, on the sides of the gate electrodes 154, the active regions 105 may be recessed and the epitaxial layers 110 may be disposed therein. The epitaxial layers 110 may be provided as source and drain regions of transistors. The epitaxial layers 110 may have elevated source and drain forms such that upper surfaces thereof are positioned to be higher than lower surfaces of the gate electrodes 154. The epitaxial layers 110 may be formed of, for example, silicon germanium (SiGe).

The gate structure 150 may include the gate electrodes 154, a gate insulating layer 152 disposed between the gate electrodes 154 and the active regions 105, and spacers 156 disposed on the side surfaces of the gate electrodes 154.

The gate insulating layer 152 may be formed of an oxide, a nitride, or an oxynitride. The gate insulating layer 152 may include, for example, a silicon oxide layer, or a high-k insulating material.

The gate electrodes 154 may be disposed to intersect the active regions 105 above the active regions 105, and a single gate electrode 154 may form a single transistor. Channel regions of a transistor may be formed in the active regions 105 intersecting the gate electrodes 154. The gate electrodes 154 may include, for example, a metal, a metal nitride, or doped polysilicon. The gate electrodes 154 may include, for example, tungsten (W), molybdenum (Mo), TiN, or TaN.

The spacers 156 may be formed on both side surfaces of the gate electrodes 154, and insulate the gate electrodes 154 from the epitaxial layers 110. The spacers 156 may be formed of, for example, an oxide, a nitride, and an oxynitride, and may be formed as a multi-layer.

The gate isolation portion 140 may be disposed on the substrate 101 such that the gate electrodes 154 extending in the x direction are cut to a predetermined length. Thus, the gate isolation portion 140 may have substantially the same width as that of the gate electrodes 154 in the y direction. Also, both side surfaces of the gate isolation portion 140 in the y direction may be coplanar with the gate electrodes 154.

The gate isolation portion 140 may include first and second layers 142 and 144. The first layer 142 may be disposed on both side surfaces of the second layer 144 in the y direction. The first and second layers 142 and 144 may be formed of materials having a different etch selectivity with respect to each other, but the present inventive concept is not limited thereto. The first and second layers 142 and 144 may be formed of at least one among a silicon-contained material such as a silicon dioxide ($SiO_2$), a silicon oxynitride (SiON), a silicon nitride ($Si_3N_4$), and polysilicon, or a metal.

The gate isolation portion 140 may have a third length L3 in the x direction. The third length L3 may be equal to or less than 50 nm, and may be, for example, within a range from 10 nm to 40 nm. In the present example embodiment, since the first layer 142 is disposed only on the sides of the second layer 144 in one direction (e.g., the y direction), rather than on all the sides of the second layer 144, the third length L3 may be minimized. In the gate isolation portion 140, a width W3 of the first layer 142 in the y direction may be smaller than a width W4 of the second layer 144 in the y direction, but the present inventive concept is not limited thereto.

Referring to FIG. 10B, a semiconductor device 100a may include a substrate 101, active regions 105, a gate structure 150 including gate electrodes 154, and a gate isolation portion 140a disposed between the gate electrodes 154 in the x direction.

In the present example embodiment, unlike that of the semiconductor device 100 of FIG. 10A, lengths of both ends of the gate isolation portion 140a in the y direction may be different. For example, a length L4 of one end of the gate isolation portion 140a may be shorter than a length L5 of the other end thereof. The gate isolation portion 140 may have such a shape when an oval mask pattern is used to form the gate isolation portion 140a, as described hereinafter with reference to FIG. 18.

FIGS. 12 through 29 are views illustrating sequential processes of a method for manufacturing a semiconductor device according to example embodiments of the present inventive concept.

Figure 12:
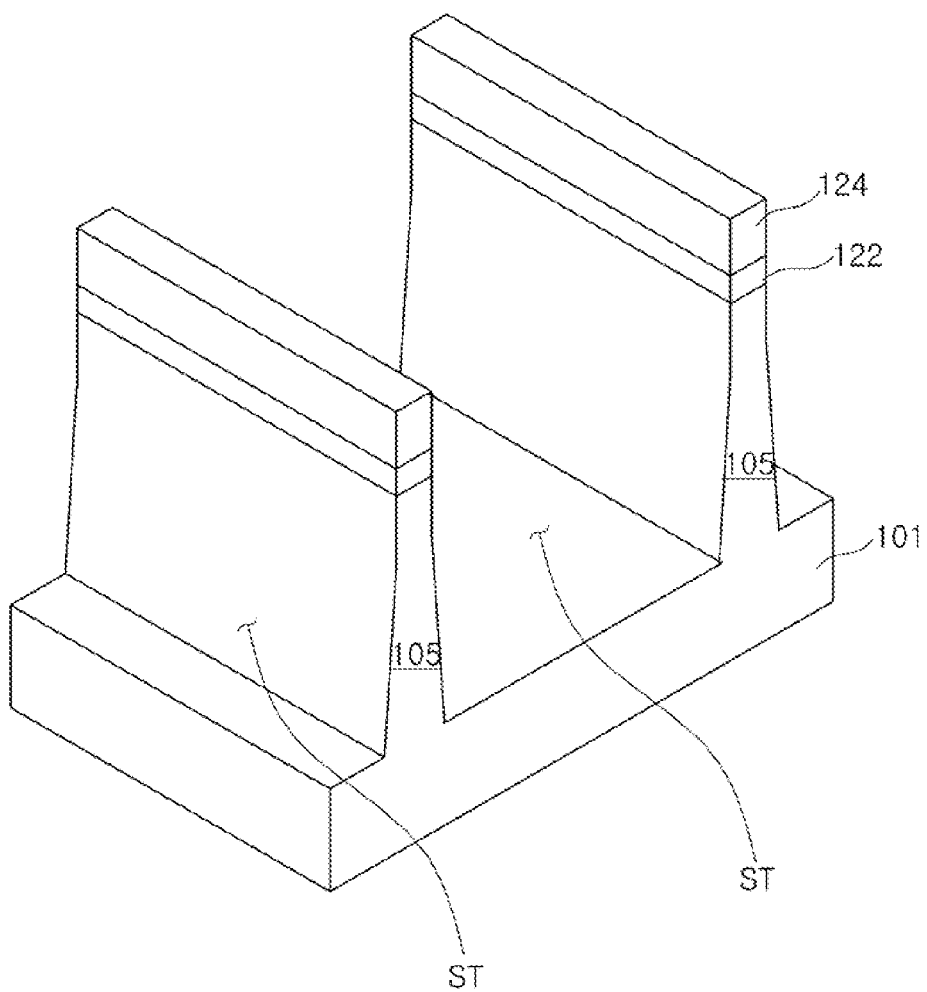
FIGS. 12 through 29 are views illustrating sequential processes of a method for manufacturing a semiconductor device according to example embodiments of the present inventive concept.

Referring to FIG. 12, a substrate 101 may be patterned to form a trench ST defining active regions 105.

First, a pad oxide pattern 122 and a mask pattern 124 may be formed on the substrate 101. The pad oxide pattern 122 may be a layer for protecting an upper surface of the active region 105 and may be omitted according to example embodiments. The mask pattern 124, a mask layer for patterning the substrate 101, may include a silicon nitride, a carbon inclusion, and the like. Also, the mask pattern 124 may have a multilayer structure.

The trench ST may be formed by anisotropically etching the substrate 101 using the pad oxide pattern 122 and the mask pattern 124. The trench ST has a high aspect ratio, having a width reduced downwardly. Thus, the active regions 105 may have a shape narrowed upwardly.

Figure 13:
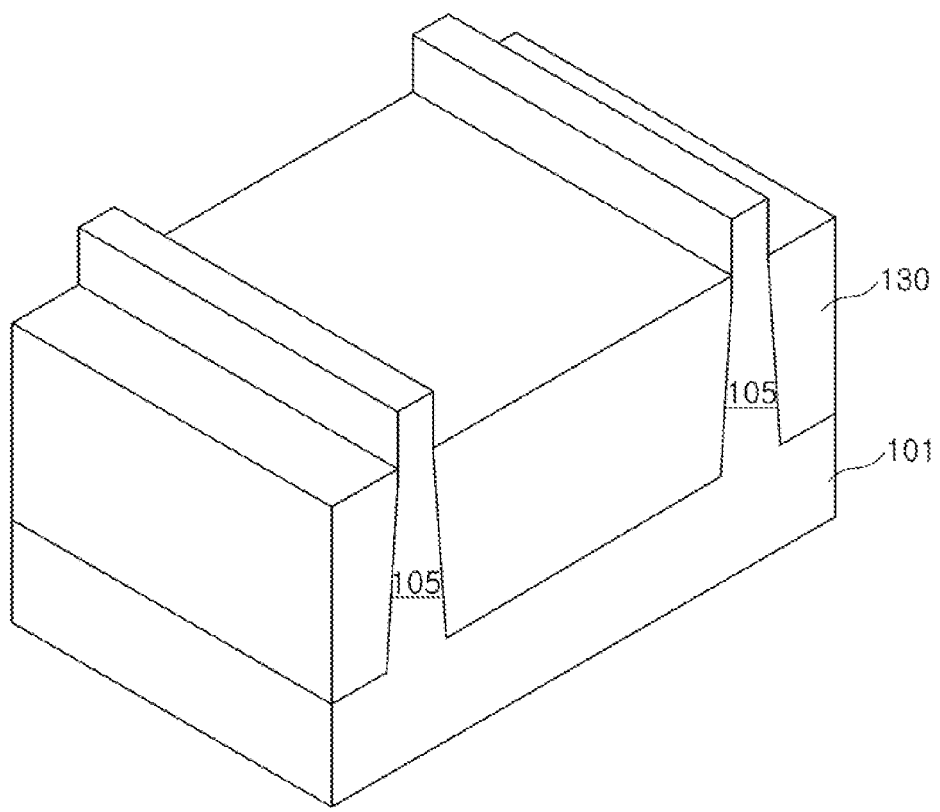

Referring to FIG. 13, an isolation layer 130 may be formed to fill the trench ST.

First, after the trench ST is filled with an insulating material, a planarization process may be performed. During the planarization process, at least portions of the pad oxide pattern 122 and the mask pattern 124 may be removed. In an example embodiment, a relatively thin liner layer may be first formed within the trench ST, and the trench ST may be subsequently filled.

Next, a portion of the insulating material filling the trench ST may be removed to allow the active regions 105 to protrude. This process may be a wet etching process using at least a portion of the pad oxide pattern 122 as an etch mask. Accordingly, the active regions 105 may protrude upwardly so as to be provided as active fins. In example embodiments, the height to which the active region 105 protrudes may be varied. During the etching operation, the pad oxide pattern 122 may also be removed together.

Figure 14:
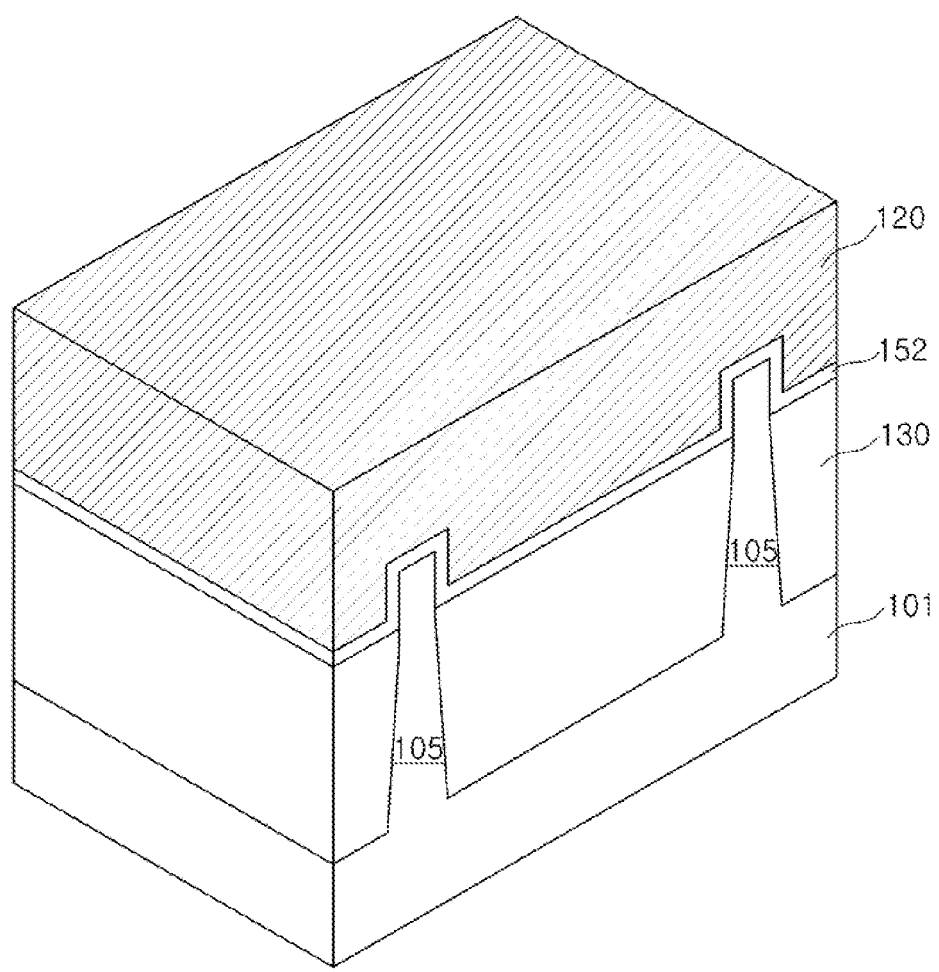

Referring to FIG. 14, a gate insulating layer 152 and a sacrificial layer 120 covering the active regions 105 may be formed.

The gate insulating layer 152 may be formed on upper surfaces and side surfaces of the active regions 105. The gate insulating layer 152 may be, for example, a silicon oxide layer.

The sacrificial layer 120 may serve to form the gate electrodes 154 (refer to FIGS. 10A and 11), and may be removed during a follow-up process. The sacrificial layer 120 may be, for example, a polysilicon layer.

In an example embodiment, a capping layer may be further formed on the sacrificial layer 120 in order to protect the sacrificial layer 120 during a follow-up process.

Figure 15:
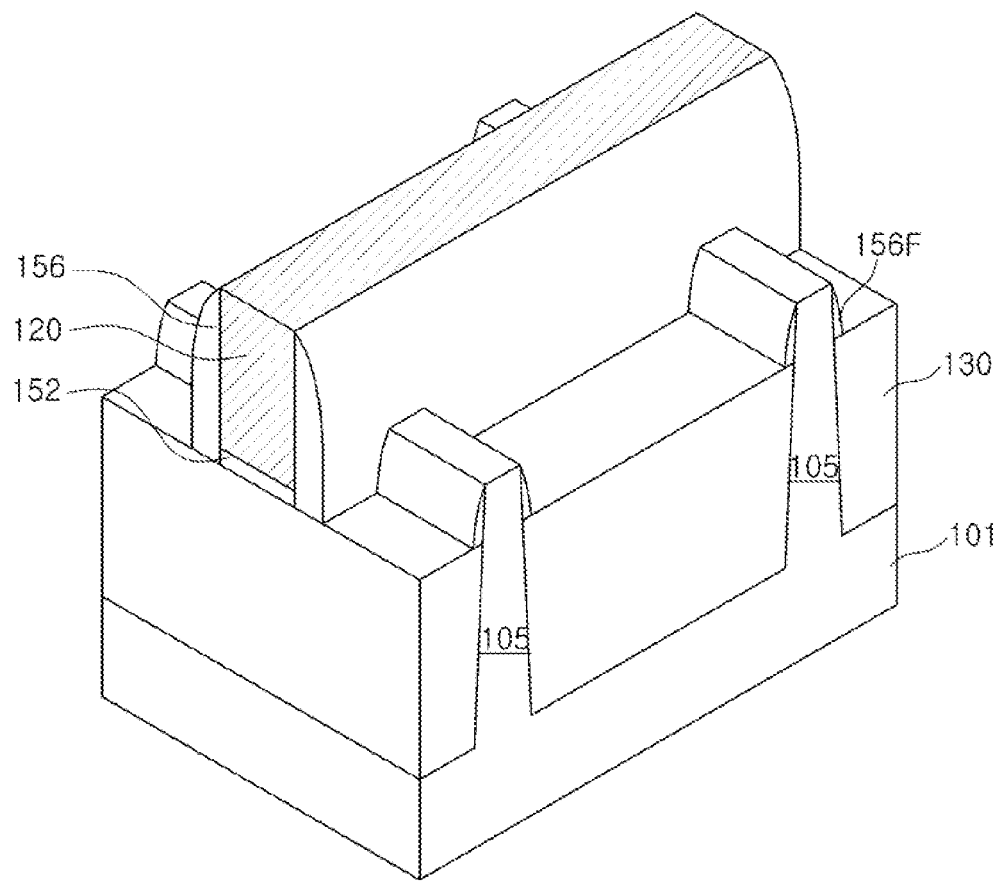

Referring to FIG. 15, the gate insulating layer 152 and the sacrificial layer 120 may be patterned and spacers 156 may be formed on both side surfaces of the gate insulating layer 152 and the sacrificial layer 120.

The gate insulating layer 152 and the sacrificial layer 120 may be patterned to traverse the active regions 105. The gate insulating layer 152 and the sacrificial layer 120 may be sequentially patterned using a mask. When the sacrificial layer 120 is patterned, the gate insulating layer 152 may be used as an etch stop layer.

The spacers 156 may be formed by forming a layer having a uniform thickness on the sacrificial layer 120 and anisotropically etching the same. During this process, spacers 156F may also be formed on both side surfaces of the active regions 105 protruding from the substrate 101.

Figure 16:
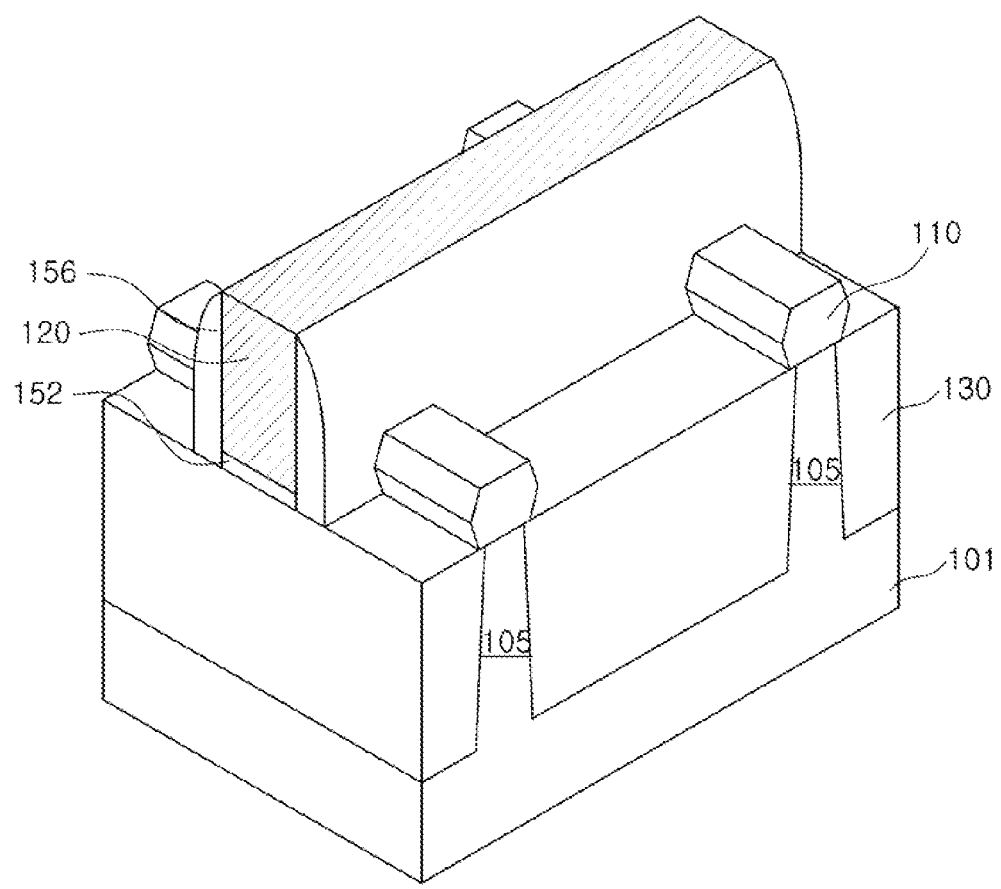

Referring to FIG. 16, epitaxial layers 110 may be formed on the active regions 105 on both sides of the sacrificial layer 120.

First, a process of implanting an impurity to the active regions 105 on both sides of the sacrificial layer 120 may be performed. The implantation process may be performed using the sacrificial layer 120 and the spacers 156 as masks. However, the implantation process may also be performed in a later step.

Next, the active regions 105 on both sides of the sacrificial layer 120 may be selectively etched to form recesses to a predetermined depth, and thereafter, the epitaxial layer 110 may be formed. The recesses may be formed by etching portions of the active regions 105 using a separately formed mask layer or using the sacrificial layer 120 as a mask. In a case in which the sacrificial layer 120 is used as a mask, a capping layer may be formed on the sacrificial layer 120 during the process described above with reference to FIG. 14 to protect the sacrificial layer 120.

The recesses may be formed by sequentially applying a dry etching process and a wet etching process. After the recesses are selectively formed, a process of curing surfaces of the recessed active regions 105 may be performed. In this example embodiment, it is illustrated that upper surfaces of the recessed active regions 105 are coplanar with the upper surface of the isolation layer 130, but the present inventive concept is not limited thereto. In an example embodiment, upper surfaces of the recessed active regions 105 may be higher or lower than the upper surface of the isolation layer 130.

Finally, the epitaxial layers 110 may be formed on the recesses by performing a selective epitaxial growth (SEG) process. A size of the epitaxial layers 110 may not be limited to those illustrated. The epitaxial layer 110 may be, for example, silicon germanium (SiGe) layers. When silicon germanium (SiGe) is grown on the active regions 105 formed of silicon (Si) or the like, compressive stress may occur in a channel region of a transistor. Such compressive stress may increase as a concentration of germanium (Ge) increases. In an example embodiment, the concentration of germanium (Ge) may vary in the epitaxial layers 110 according to heights of the epitaxial layers 110.

In the present example embodiment, it is illustrated that the spacers 156F (refer to FIG. 15) formed on the side surfaces of the active regions 105 are removed together, but the present inventive concept is not limited thereto and at least a portion of the spacers 156F may be remained on the side surfaces of the epitaxial layers 110.

The epitaxial layers 110 may be epitaxial layers which have been doped with an impurity. The doping of the epitaxial layers 110 may be performed in-situ during growth thereof, or may be performed by ion implantation after growth thereof. The grown epitaxial layers 110 may be provided as source and drain regions of a transistor.

Figure 17:
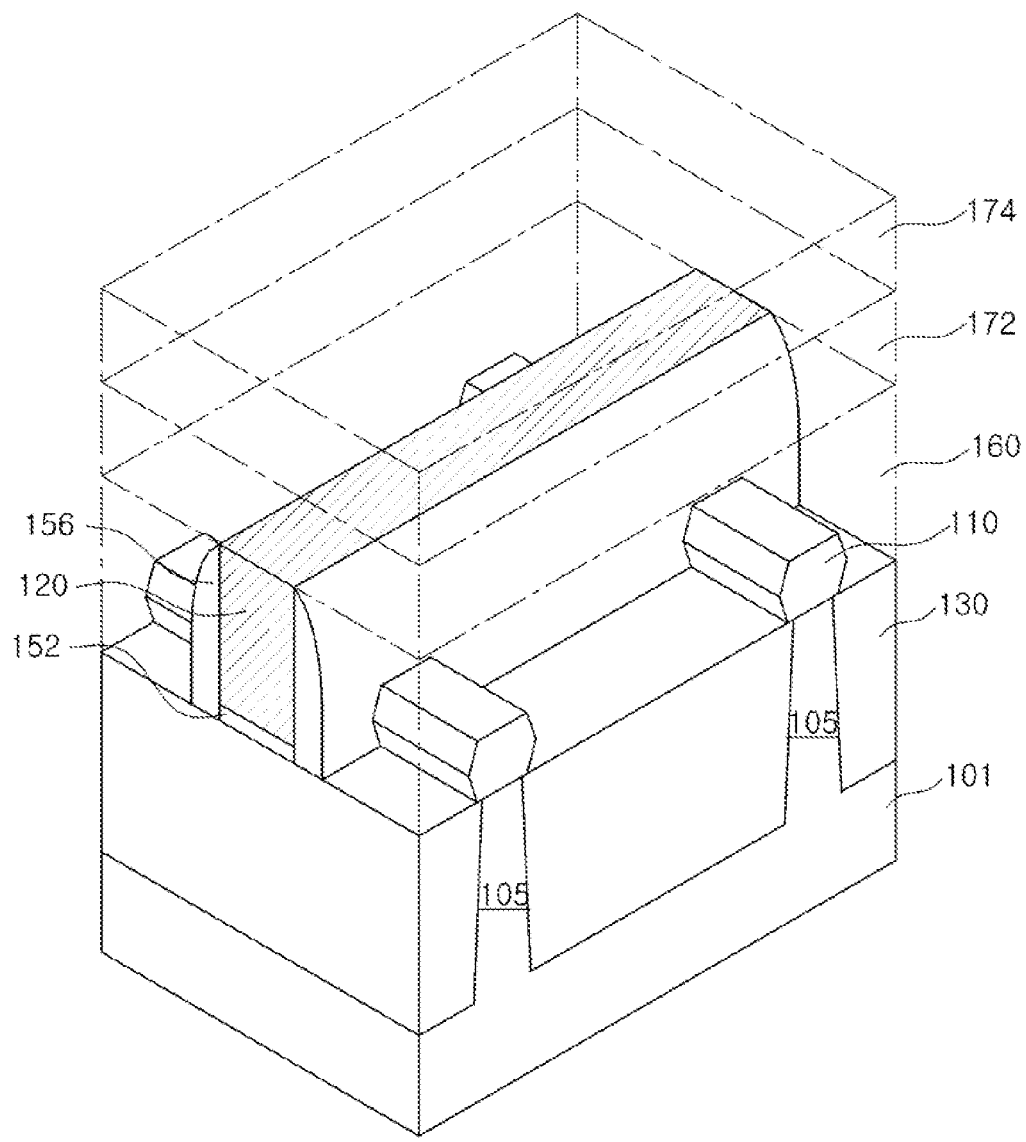

Referring to FIG. 17, an interlayer insulating layer 160 may be formed on the epitaxial layers 110, and first and second mask layers 172 and 174 may be formed on the interlayer insulating layer 160.

The interlayer insulating layer 160 may be formed by forming a layer covering the sacrificial layer 120, the spacers 156, and the epitaxial layers 110 with an insulating material and subsequently performing a planarization process thereon such that an upper surface of the sacrificial layer 120 is exposed.

The first and second mask layers 172 and 174 are masks serving to form the gate isolation portion 140 (refer to FIGS. 10A and 11) and may be formed of materials each having a different etch selectivity, and materials each having an etch selectivity may be selected in consideration of a material of the sacrificial layer 120. The first and second mask layers 172 and 174 may be formed of at least one among a silicon-contained material such as a silicon dioxide ($SiO_2$), a silicon oxynitride (SiON), a silicon nitride ($Si_3N_4$), and polysilicon, a carbon-contained material including a hydrocarbon compound such as ACL or SOH or derivatives thereof, and a metal or an organic substance. For example, the first mask layer 172 may be formed as a multi-layer including a silicon dioxide ($SiO_2$) and a silicon nitride (SiN), while the second mask layer 174 may be formed of SOH.

The first and second mask layers 172 and 174 may be formed through a process such as ALD, CVD, or spin coating, and a baking process or a curing process may be additionally performed according to materials.

In an example embodiment, an anti-reflective layer may be further formed on the second mask layer 174, and the anti-reflective layer may serve to prevent reflection when a follow-up photolithography process is performed. The anti-reflective layer may include an organic substance or an inorganic substance. According to example embodiments, at least a portion of the second mask layer 174 may serve as an anti-reflective layer.

Figure 18:
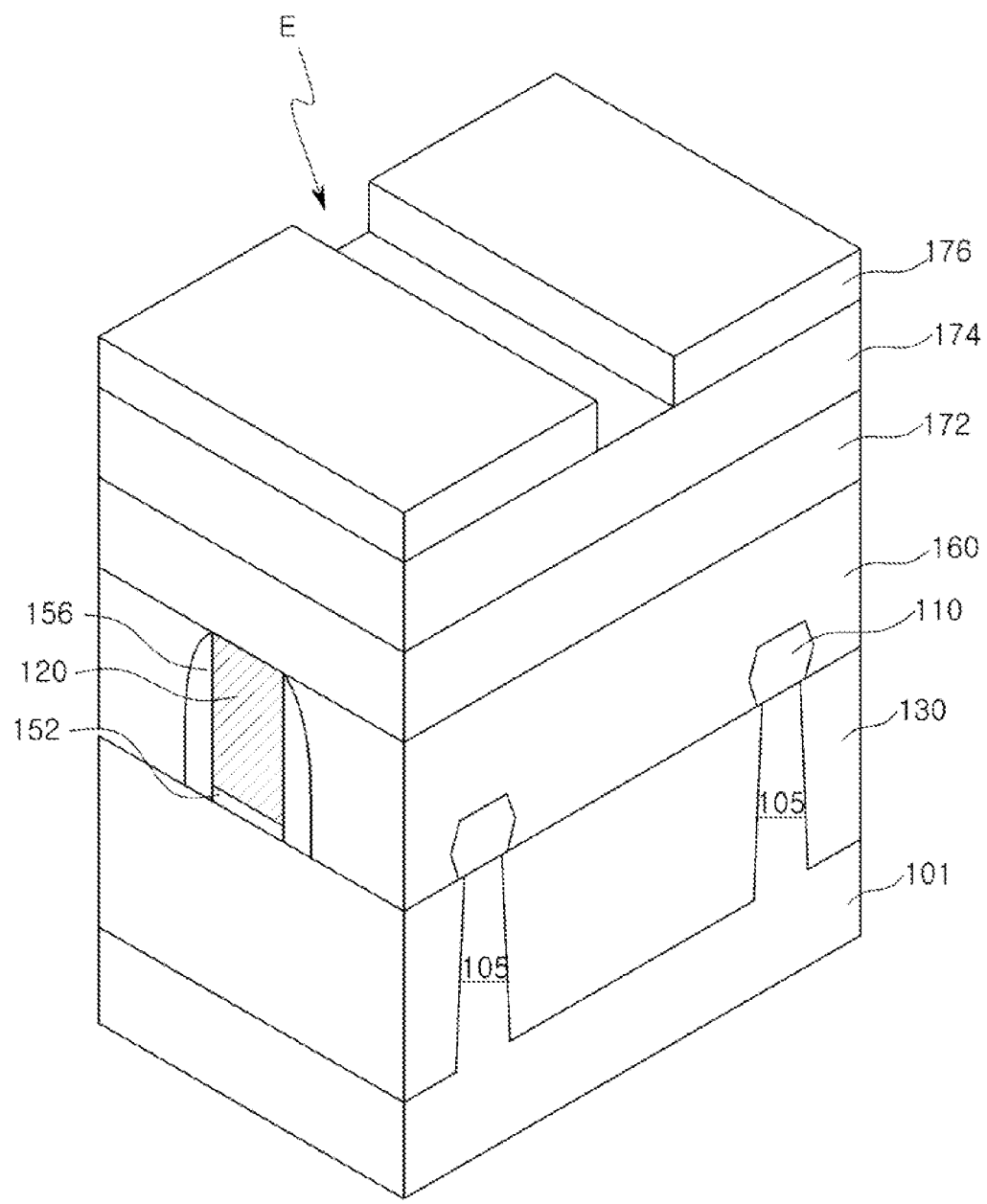

Referring to FIG. 18, a third mask layer 176 exposing a portion of the mask layer 174 may be formed on the second mask layer 174.

In detail, the third mask layer 176 may expose the second mask layer 174 through an open region E. For example, the third mask layer 176 may be a photoresist layer, but the present inventive concept is not limited thereto.

The open region E may include a region in which the gate isolation portion 140 is to be formed, and may be a region extending to be perpendicular to the sacrificial layer 120. A single region E may expose regions in which a plurality of gate isolation portions 140, for example, two gate isolation portions 140, adjacent to each other in the y direction illustrated in FIG. 10A are formed, together in a manner similar to that of FIG. 3A. Also, according to a shape of the open region E, the gate isolation portions 140*a* in which lengths of both ends in the y direction are different may be formed as illustrated in FIG. 10B.

Figure 19:
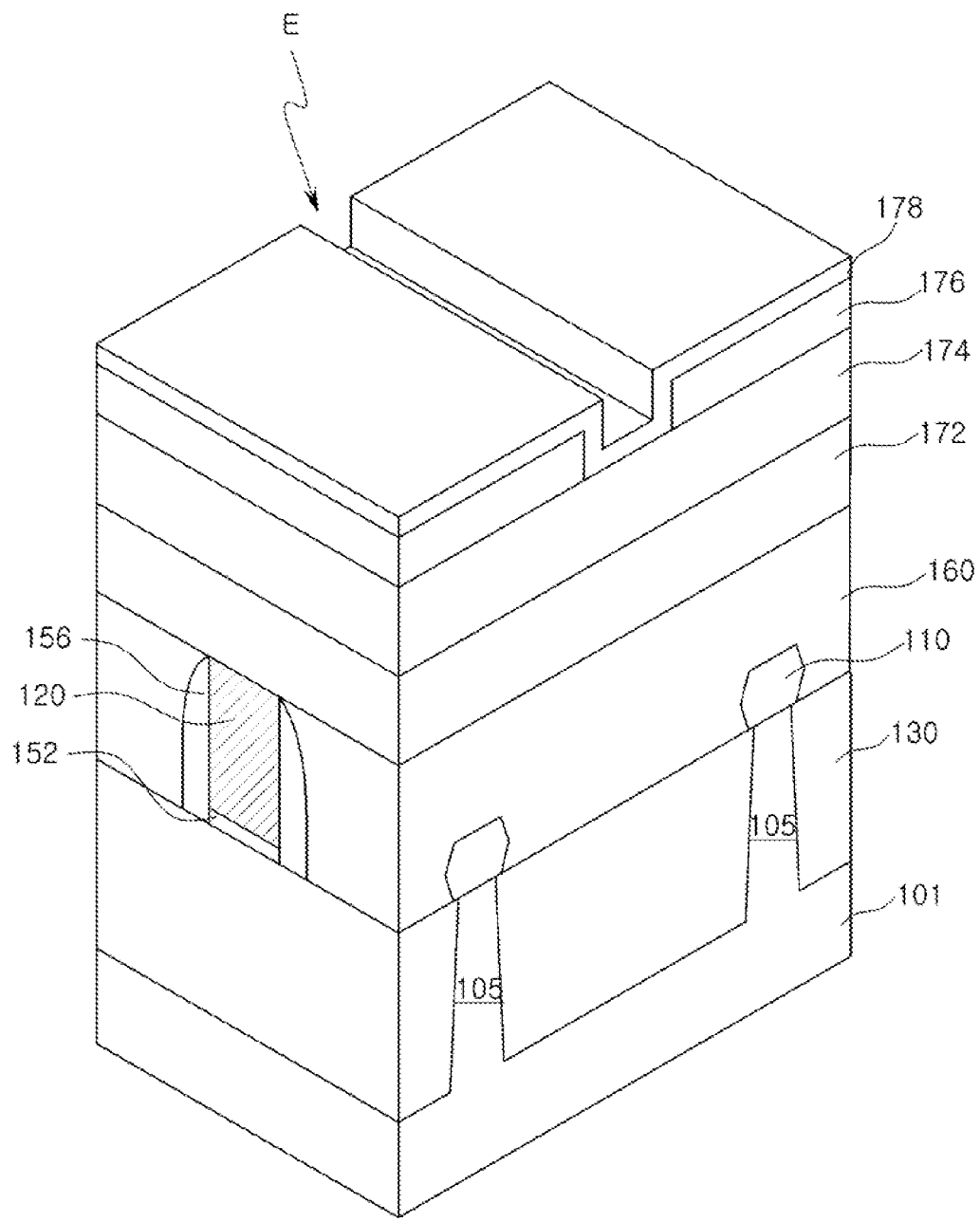

Referring to FIG. 19, a mask spacer layer 178 covering an exposed upper surface of the second mask layer 174 and the third mask layer 176 may be formed.

The mask spacer layer 178 may be formed of a material having an etch selectivity with respect to the second mask layer 174. For example, the mask spacer layer 178 may be formed of an oxide layer.

In example embodiments, materials of the sacrificial layer 120, the first to third mask layers 172, 174, and 176, and the mask spacer layer 178 are not limited to those mentioned above, and materials each having a mutually different etch selectivity with respect to predetermined etch conditions in the layers adjacent to each other may be selected.

Figure 20:
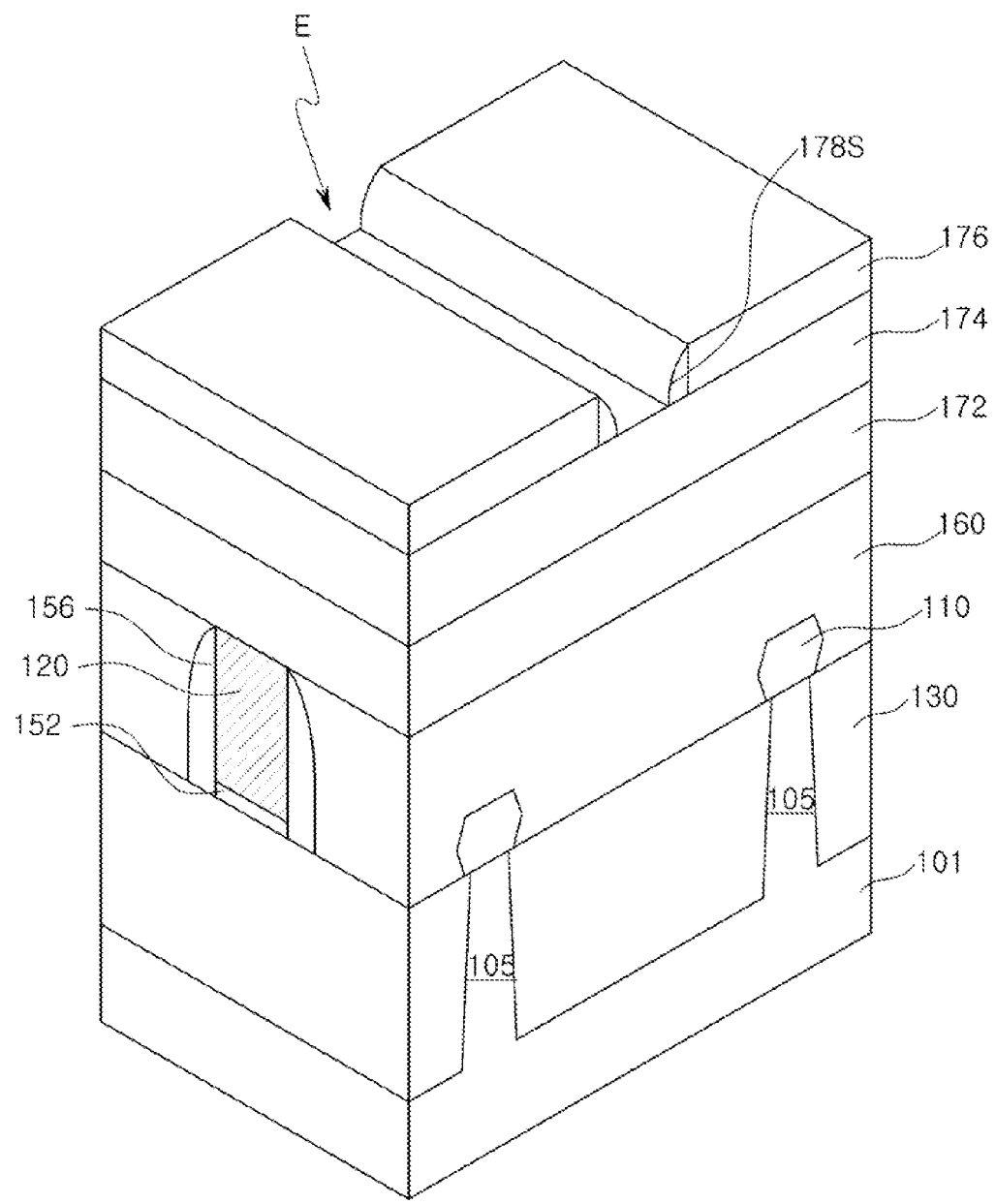

Referring to FIG. 20, the mask spacer layer 178 may be etched to form mask spacers 178s on sidewalls of the third mask layer 176.

The mask spacers 178S may be formed by etching the mask spacer layer 178 until the second mask layer 174 is exposed in the open region E.

The mask spacers 178S may be used to reduce the size of the open region E to form a pattern smaller than a pattern defined by the third mask layer 176. Thus, a thickness of the mask spacer 178S on one sidewall of the third mask layer 176 may be determined in consideration of a size of the gate isolation portion 140 desired to be formed. For example, a width of the second mask layer 174 exposed between the mask spacers 178S may be determined in consideration of the third length L3 (refer to FIG. 10A) of the gate isolation portion 140.

Figure 21:
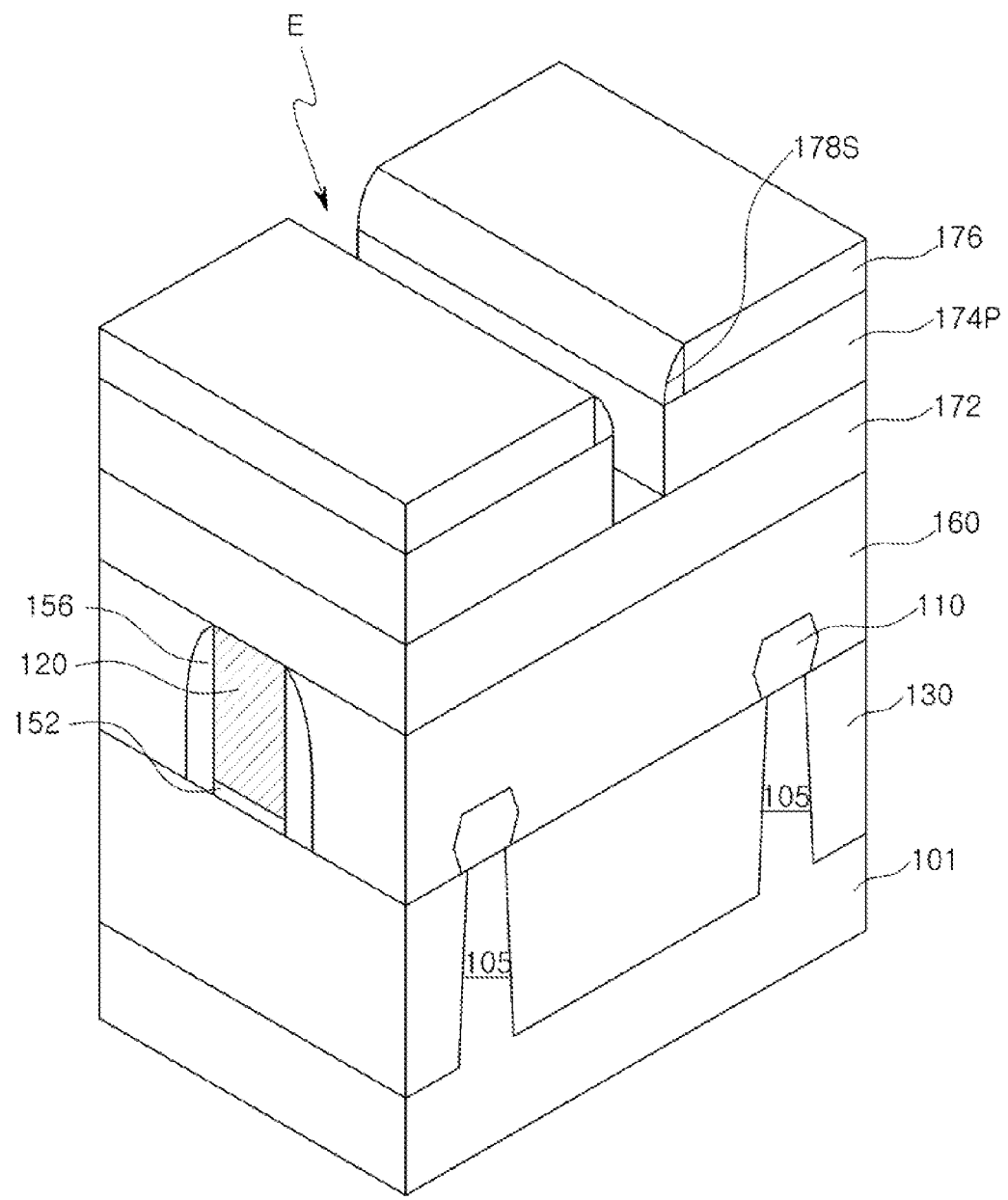

Referring to FIG. 21, the exposed second mask layer 174 may be etched using the third mask layer 176 and the mask spacers 178S to form second mask pattern layers 174P.

Accordingly, an upper surface of the first mask layer 172 may be exposed in the open region E. While the second mask layer 174 is being etched, portions of the third mask layer 176 and the mask spacers 178S may also be removed so the third mask layer 176 and the mask spacers 178S may be reduced in height.

Figure 22:
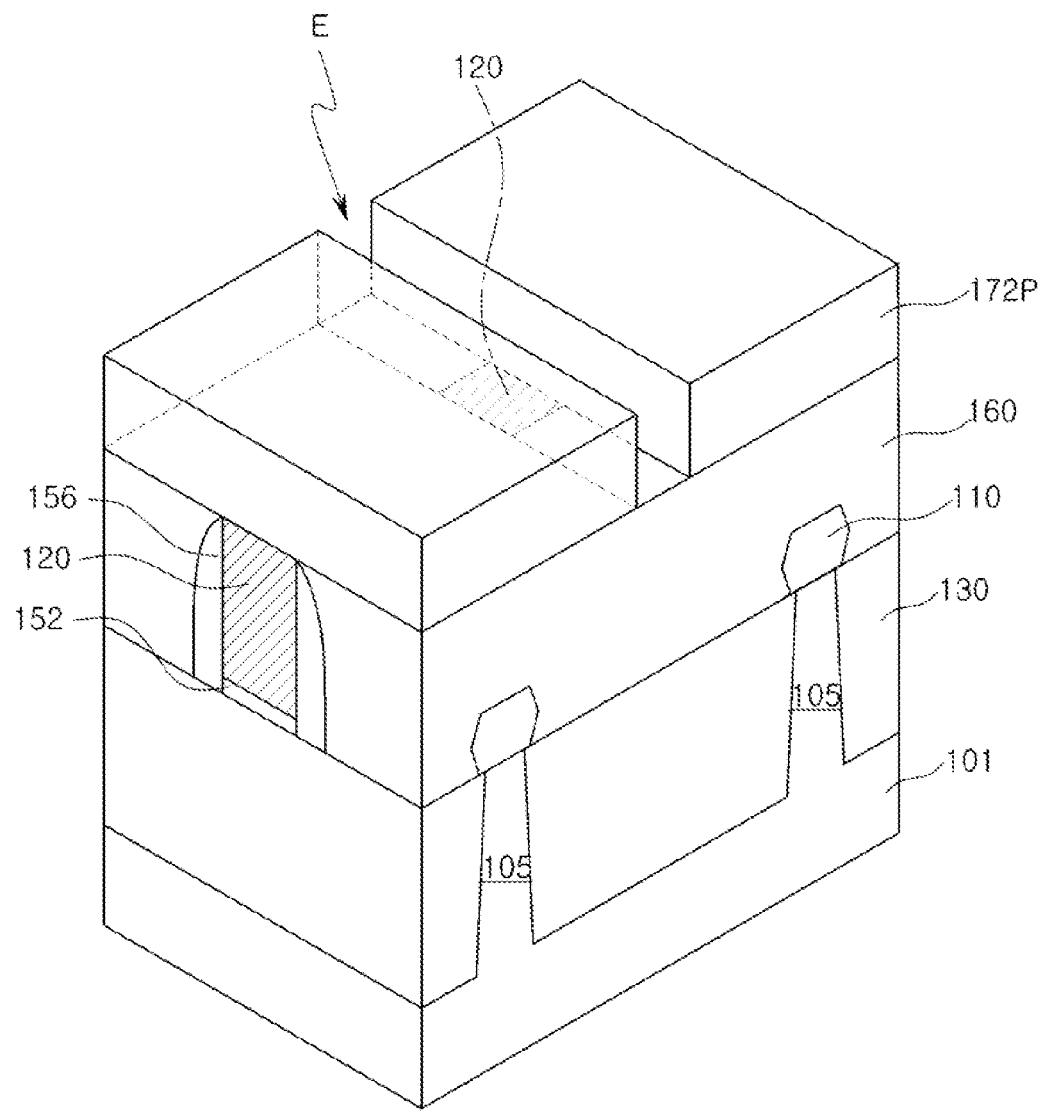

Referring to FIG. 22, the exposed first mask layer 172 may be etched using the second mask pattern layer 174P to form first mask pattern layers 172P.

Accordingly, upper surfaces of the interlayer insulating layer 160 and the sacrificial layer 120 may be exposed to the open region E. While the first mask layer 172 is being etched, the third mask layer 176 and the mask spacers 178S may also be removed. The second mask pattern layer 174P may be removed while the first mask layer 172 is etched, or may be removed through a separate process. Alternatively, at least a portion of the second mask pattern layer 174P may be remained on the first mask pattern layer 172P.

The patterning processes of the mask layers described above with reference to FIGS. 17 through 22 may be variously modified according to example embodiments. For example, the number, materials, and sequential patterning schemes of the mask layers may be variously modified.

Figure 23:
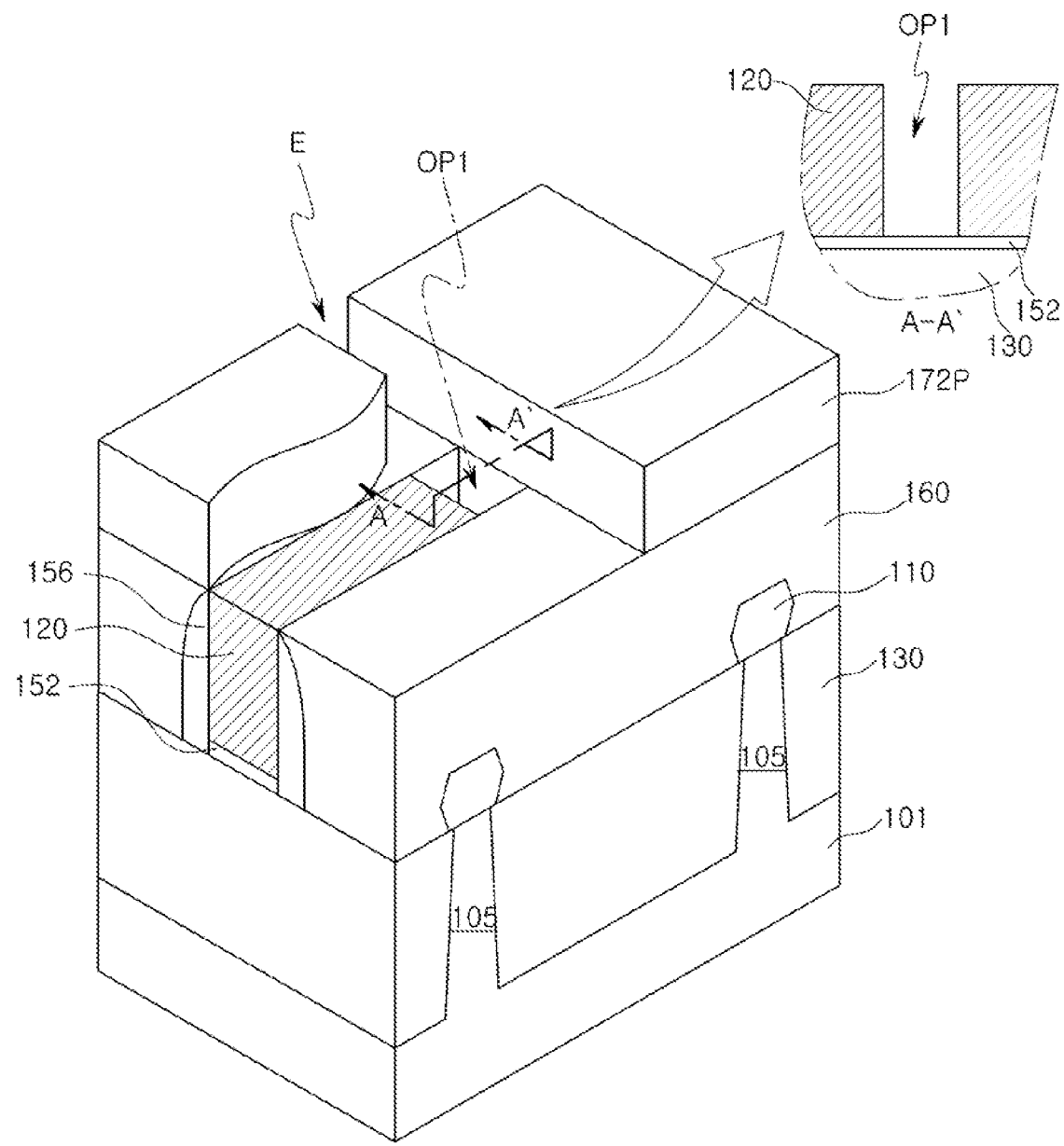

Referring to FIG. 23, the exposed sacrificial layer 120 may be etched using the first mask pattern layer 172P to form a first opening OP1. In FIG. 23, a cross-section taken along line A-A' is also illustrated, and hereinafter, cross-sections are illustrated together in FIGS. 24 through 29 in the same manner. Also, in FIGS. 23 through 25, to help understand, it is illustrated that the first mask pattern layer 172P on the left of the first opening OP1 is partially cut away.

The first opening OP1 having a hole shape may be formed by selectively etching only a material of the sacrificial layer 120 in the region exposed through the open region E. For example, a first part of the sacrificial layer 120 may be removed. The sacrificial layer 120 may be selectively removed by wet etching or dry etching. Thus, the interlayer insulating layer 160 near the first opening OP1 may be remained.

The gate insulating layer 152 may be exposed from a lower portion of the first opening OP1, and the sacrificial layer 120 and the spacers 156 may be exposed from sidewalls of the first opening OP1. In an example embodiment, the gate insulating layer 152 may also be removed together from the lower portion of the first opening OP1 to expose an upper surface of the isolation layer 130.

In the present example embodiment, after the epitaxial layers 110 are formed, the process of cutting the sacrificial layer 120 is performed, and thus, even though the sacrificial layer 120 is formed of silicon, defect generation as nodules are formed due to silicon grown from the sacrificial layer 120 within the first opening OP1 can be prevented.

Figure 24:
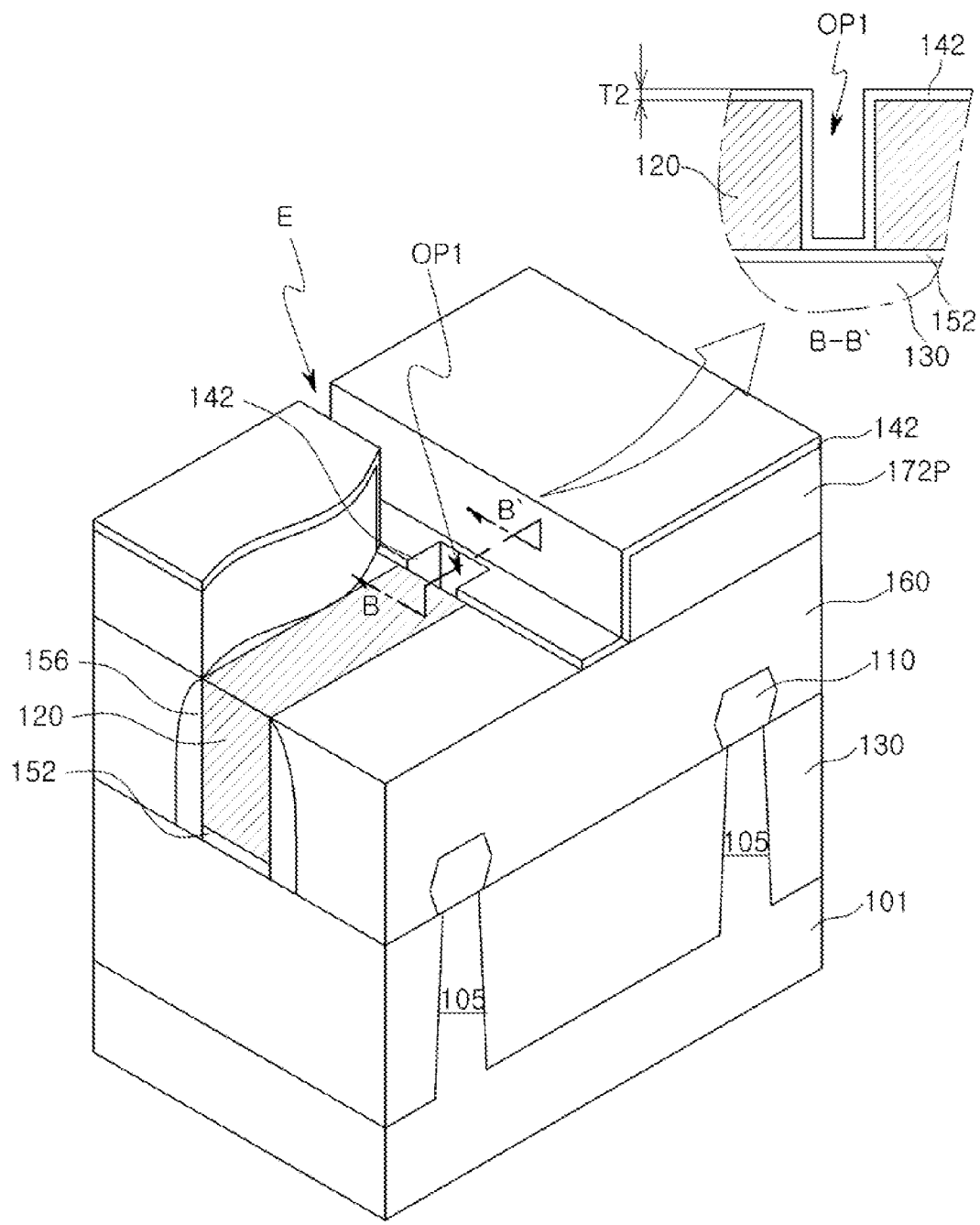

Referring to FIG. 24, a first layer 142 of the gate isolation portion 140 covering the sacrificial layer 120, the sidewalls of the spacers 156, and the upper surface of the gate insulating layer 152 exposed through the first opening OP1 may be formed.

A second thickness T2, a thickness of the first layer 142, may be equal to or less than 100 Å, and the first layer 142 may be formed using ALD. The second thickness T2 may be determined in consideration of a third length L3 (refer to FIG. 10A), a size of the gate isolation portion 140 intended to be finally formed. For example, the second thickness T2 may be determined such that the length of the first opening OP1 after the formation of the first layer 142 corresponds to the third length L3, the length of the gate isolation portion 140 in the x direction.

In an example embodiment, the first layer 142 may be formed by oxidizing a portion of the sacrificial layer 120 exposed through the first opening OP1. Thus, the first layer 142 may be formed only on the sidewalls of the first opening OP1.

Figure 25:
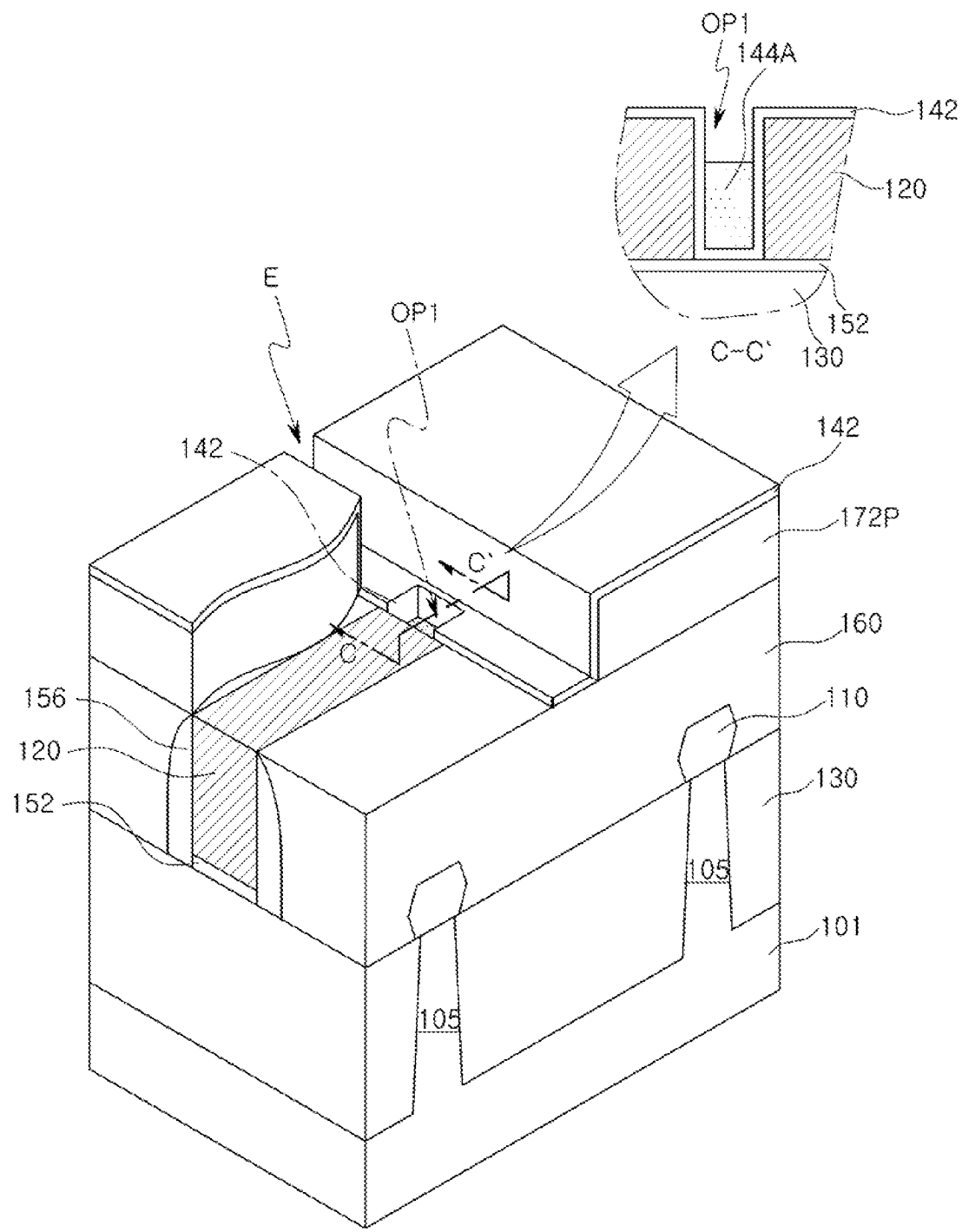

Referring to FIG. 25, a lower layer 144A of a second layer 144 of the gate isolation portion 140 filling a portion of the first opening OP1 may be formed.

The lower layer 144A may be formed by adjusting materials and/or process conditions such that a material forming the lower layer 144A may be deposited from the lower portion of the first opening OP1. For example, the lower layer 144A may be formed of a silicon nitride (SiN), but the material of the lower layer 144A is not limited thereto. A height of the lower layer 144A may be, for example, equal to or greater than a half of a height of the sacrificial layer 120.

Figure 26:
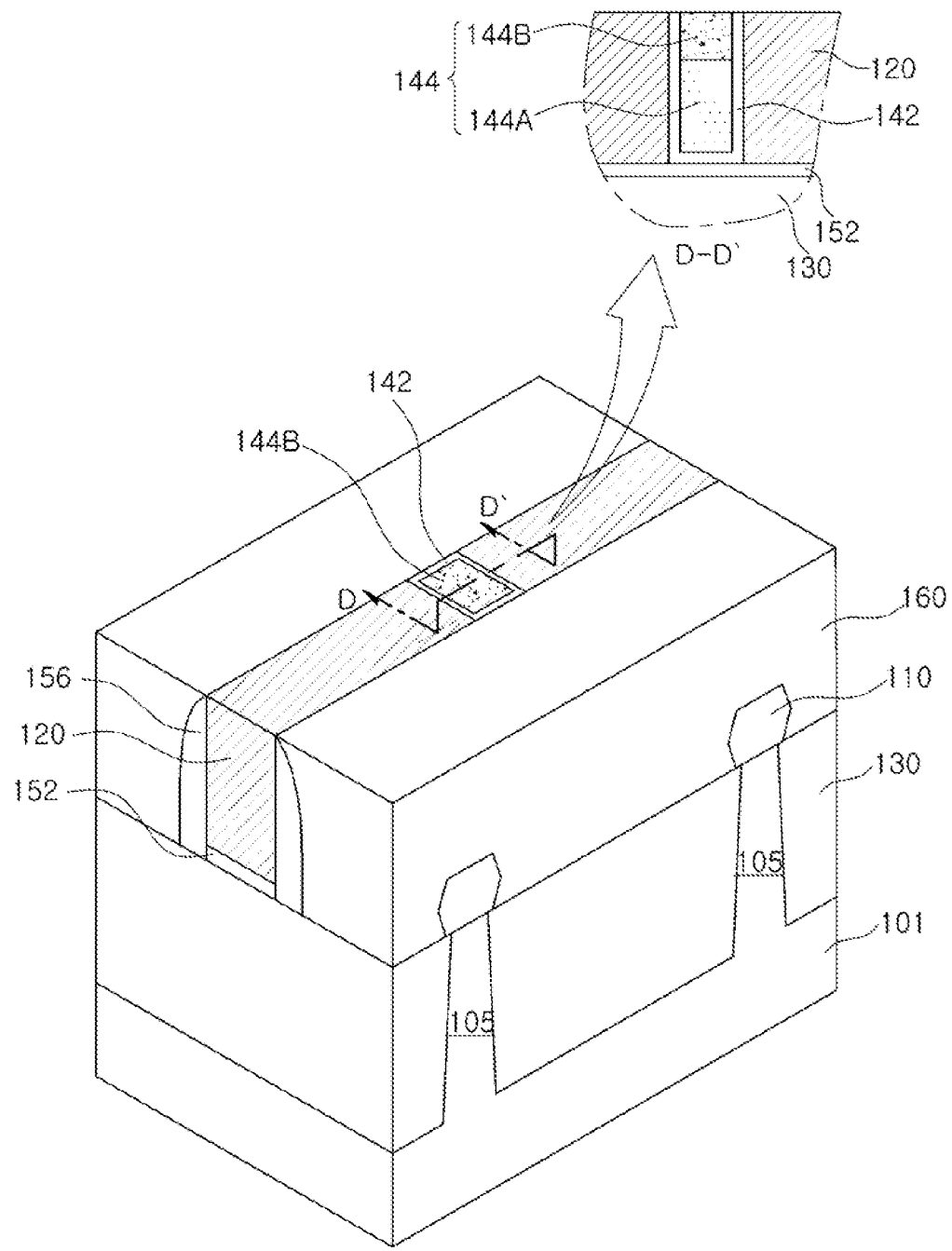

Referring to FIG. 26, an upper layer 144B of the second layer 144 may be formed to fill the first opening OP1. Accordingly, the second layer 144 including the upper layer 144B and the lower layer 144A may be formed.

The upper layer 144B may be formed of a material different from that of the lower layer 144A. For example, the upper layer 144B may be formed of a silicon dioxide ($SiO_2$), but the material of the upper layer 144B is not limited thereto.

In an example embodiment, when an aspect ratio of the first opening OP1 is large, a concave region, a void, or a seam may be formed in a central portion of the lower layer 144A. In this case, the upper layer 144B may be formed on the lower layer 144A such that the upper layer 144B fills the concave region, the void, or the seam. Thus, a horizontal interface between the upper layer 144B and the lower layer 144A are merely illustrative and may be variously modified according to example embodiments.

Also, in an example embodiment, this process may be omitted and the second layer 144 may be formed as a monolayer.

Figure 27:
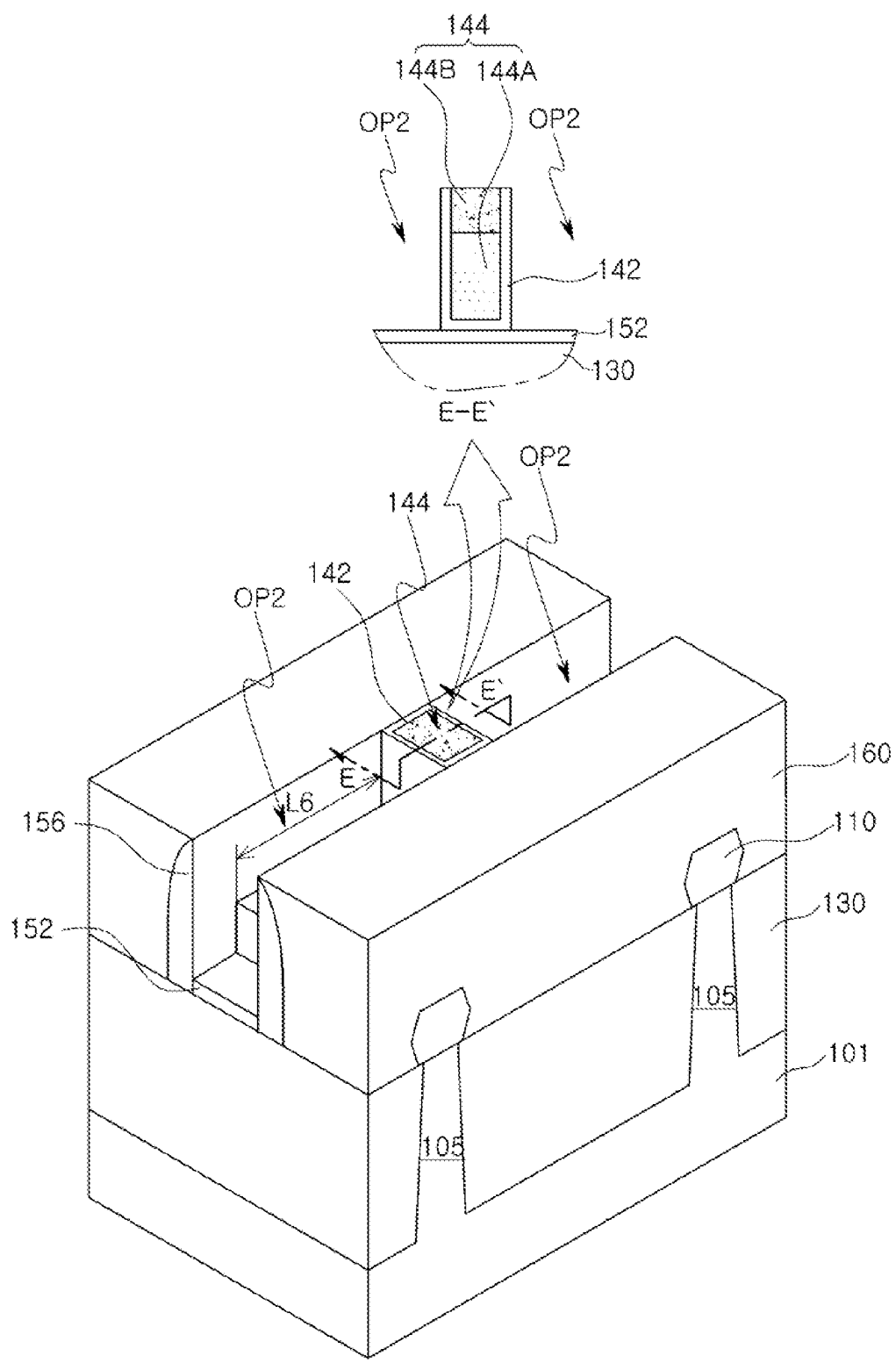

Referring to FIG. 27, the sacrificial layer 120 on both sides of the second layer 144 may be removed.

The sacrificial layer 120 may be selectively removed with respect to the first layer 142, the spacers 156, and the gate insulating layer 152 to expose the gate insulating layer 152 therebelow, and accordingly, a second opening OP2 may be formed. For example, a second part of the sacrificial pattern layers 120, which includes the remaining sacrificial pattern layer 120, may be removed.

As the process of removing the sacrificial layer 120, at least one of a dry etching process and a wet etching process may be used. For example, the sacrificial layer 120 may be removed by performing a dry etching process first, and subsequently performing a wet etching process.

A distance between one end of the active region 105 exposed within the second opening OP2 and the first layer 142 may have a sixth length L6.

Figure 28:
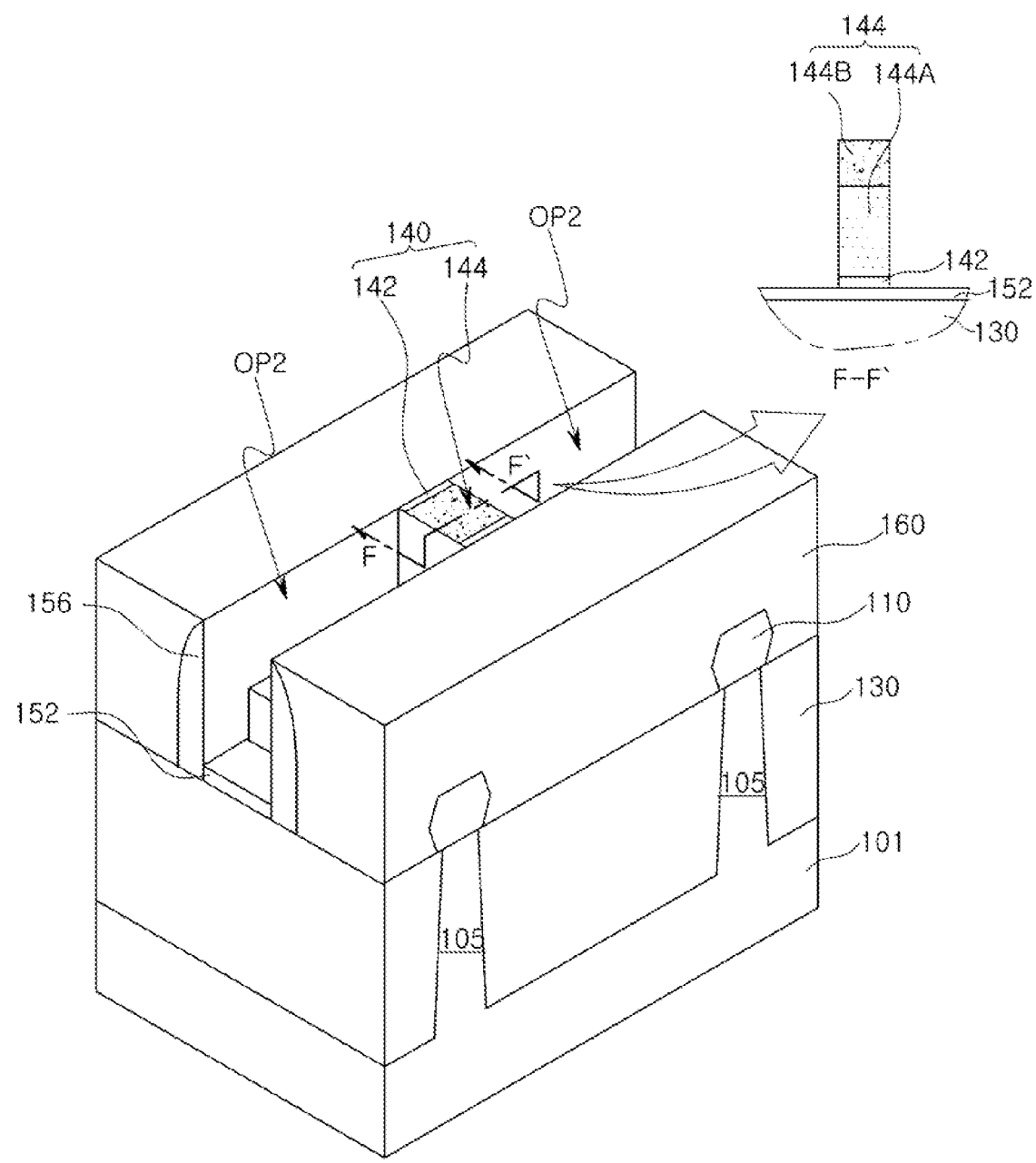

Referring to FIG. 28, a portion of the first layer 142 may exposed through the second opening OP2 may be removed.

In detail, the first layer 142 not in contact with the spacers 156 and exposed through the second opening OP2 may be removed. As the process of removing a portion of the first layer 142, for example, a wet etching process may be used. For example, the first layer 142 may be selectively etched with respect to the second layer 144, and a process may be performed such that only the first layer 142 may be etched, for example, by adjusting an etch time.

The first layer 142 may only be remained on the sidewalls between the second layer 144 and the spacers 156, and the remained first layer 142 may form the gate isolation portion 140, together with the second layer 144. Through this process, the second opening OP2 may extend toward the second layer 144. Accordingly, the sixth length L6 of FIG. 27 may increase to correspond to the thickness of the first layer 142.

In an example embodiment, a region of the first layer 142 in contact with the spacers 156, which is adjacent to the second opening OP2 may also be partially removed.

According to the present example embodiment, since a portion of the first layer 142 is removed, the gate isolation portion 140 may be formed to have even smaller length. When the gate isolation portion 140 is formed to be narrow, a distance between the active regions 105 having a fin structure and the gate isolation portion 140 may increase to obtain an advantage in terms of process such that a gap fill between the active regions 105 and the gate isolation portion 140 is enhanced when the gate electrodes 154 are formed in a follow-up process. Also, a distance between the gate electrodes 154 adjacent in one direction may be reduced to enhance integration of the semiconductor device. Also, compared with a structure without the first layer 142, the gate isolation portion 140 may be formed to be narrower even though the open region E of the third mask layer 176 (refer to FIG. 18) is formed in the same size. Thus, the semiconductor device may be manufactured without a problem in terms of process due to a reduction in size of the opening region E itself, for example, a difficulty in forming the first opening OP1 described above with reference to FIG. 23, or the like.

Figure 29:
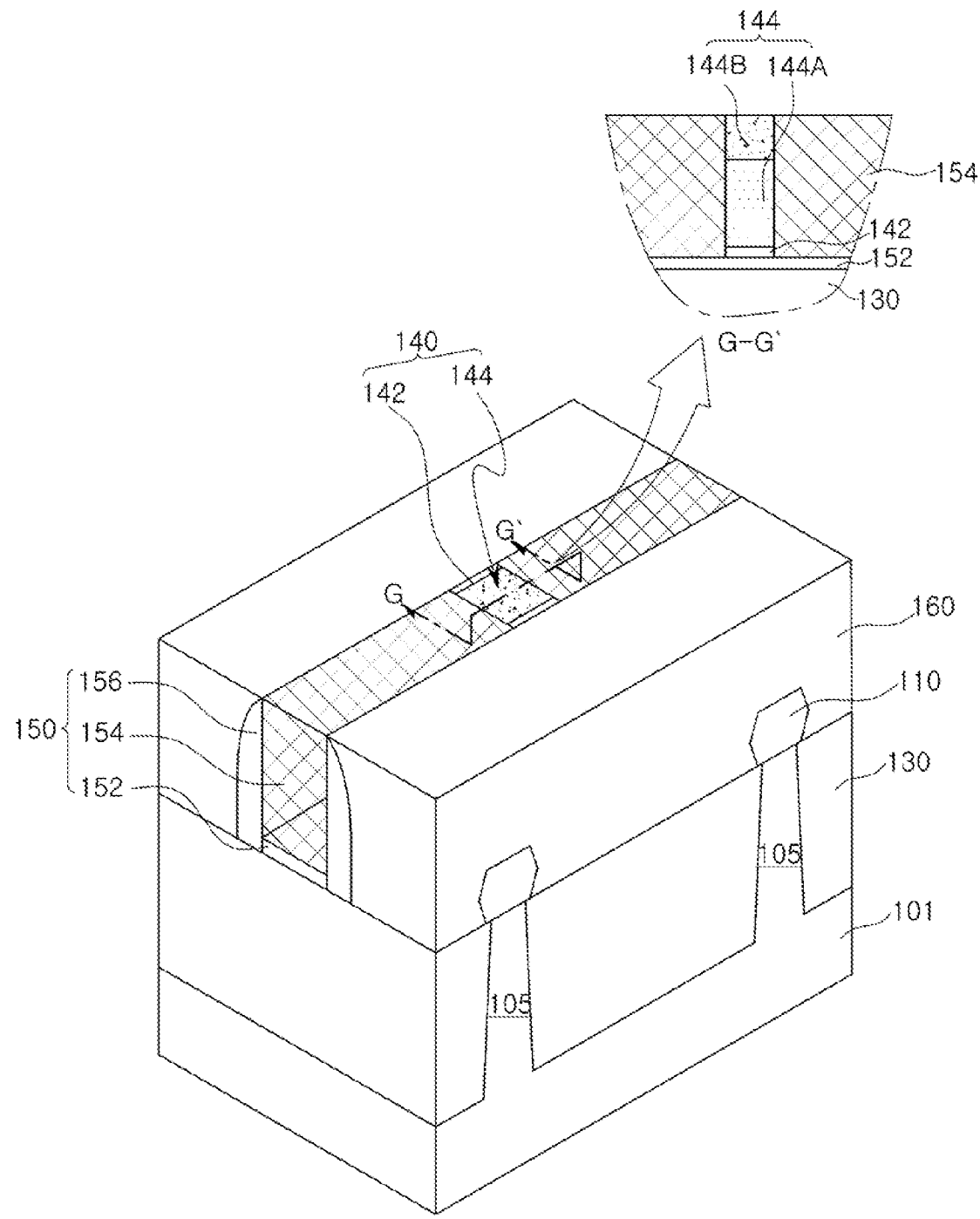

Referring to FIG. 29, a process of forming the gate electrodes 154 in the second opening OP2 may be performed. Accordingly, the gate structure 150 including the gate insulating layer 152, the gate electrodes 154, and the spacers 156 may be formed.

The gate electrodes 154 may be formed by depositing a material for forming the gate electrodes 154 within the second opening OP2 and planarizing the same. As illustrated, adjacent gate electrodes 154 which are arranged in a row in a direction crossing the active region 105 may be separated by the gate isolation portion 140. For example, the gate electrodes 154 may be made of, for example, a polysilicon or a metal.

After this process, a process of forming contact plugs electrically connected to the gate electrodes 154 and the epitaxial layer 110 and wirings connected to the contact plugs may be performed.

Figure 30:
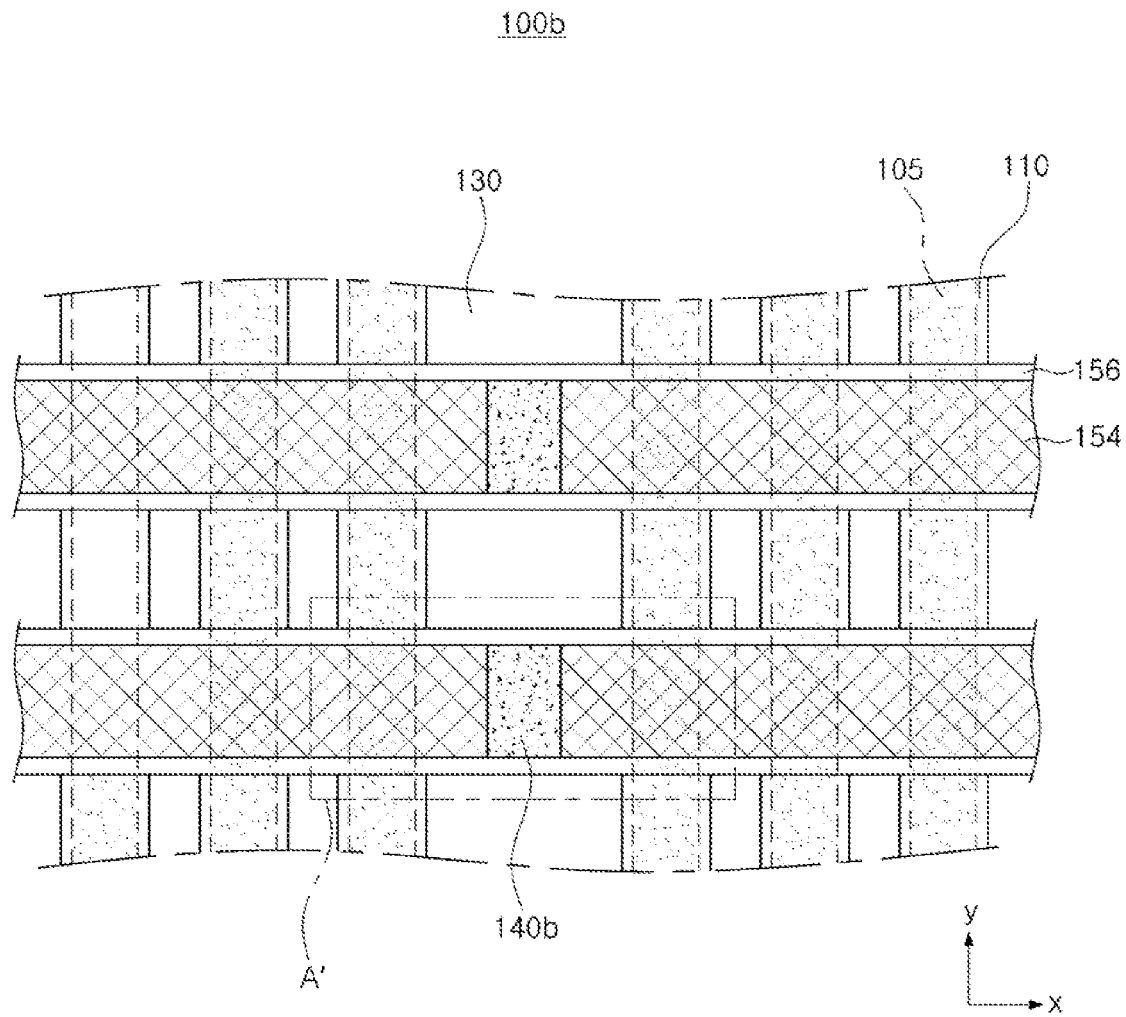
FIGS. 30 and 31 are a plan view and a perspective view illustrating a semiconductor device that can be realized by applying the method for forming a pattern of a semiconductor device according to example embodiments of the present inventive concept.
Figure 31:
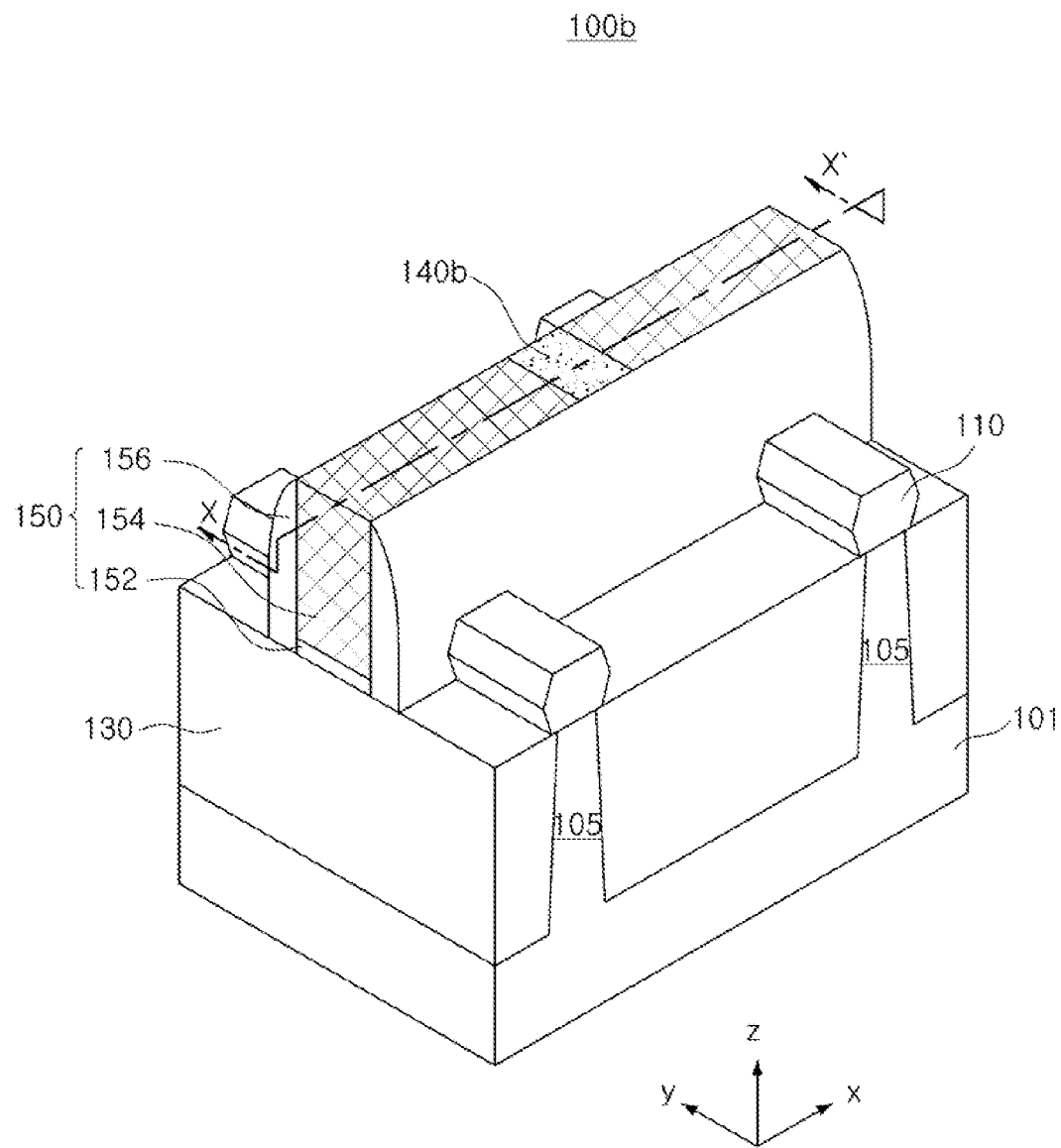

FIGS. 30 and 31 are a plan view and a perspective view illustrating a semiconductor device that can be realized by applying the method for forming a pattern of a semiconductor device according to example embodiments of the present inventive concept. FIG. 31 illustrates a portion corresponding to region 'A" of FIG. 30.

Referring to FIGS. 30 and 31, a semiconductor device 100b may include a substrate 101, active regions 105 extending on the substrate 101 in the y direction, a gate structure 150 including gate electrodes 154 extending in the x direction on the active regions 105, and a gate isolation portion 140b disposed between the gate electrodes 154 in the x direction.

Unlike the semiconductor devices 100 and 100a of FIGS. 10A through 11, in the semiconductor device 100b according to the present example embodiment, the gate isolation portion 140b may be formed as a monolayer. The gate isolation portion 140b may be disposed on the substrate 101 such that the gate electrodes 154 cut to a predetermined length. Thus, the gate isolation portion 140b may have substantially the same width as that of the gate electrodes 154 in the y direction. Also, both side surfaces of the gate isolation portion 140b in the y direction may be coplanar with the gate electrodes 154.

FIGS. 32 through 36 are views illustrating sequential processes of a method for manufacturing a semiconductor device according to example embodiments of the present inventive concept. Specifically, FIGS. 32 through 36 are cross-sectional views taken along line X-X' of FIG. 31.

First, referring to FIGS. 12 through 23, a process of forming the active regions 105, the sacrificial layer 120, the epitaxial layer 110, and the first mask pattern layer 172P may be performed.

Figure 32:
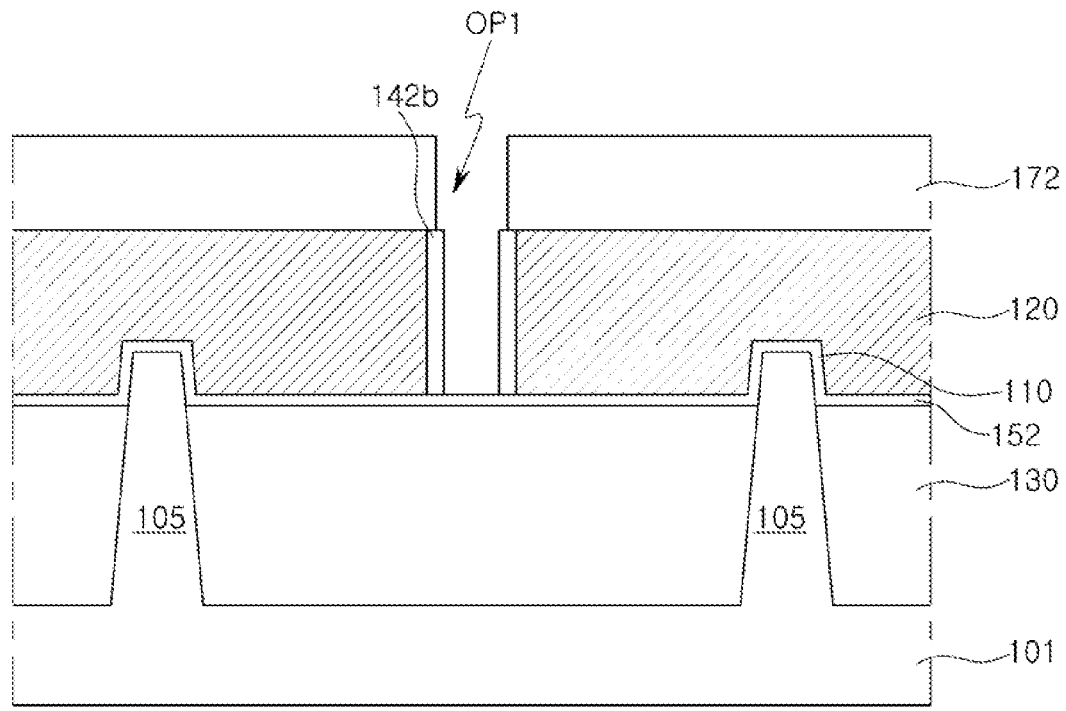
FIGS. 32 through 36 are views illustrating sequential processes of a method for manufacturing a semiconductor device according to example embodiments of the present inventive concept.

Next, referring to FIG. 32, the first layer 142b may be formed by oxidizing the sacrificial layer 120 exposed through the first opening OP1 to a predetermined thickness.

For example, in a case in which the sacrificial layer 120 is formed of polysilicon and the spacers 156 is formed of a silicon oxide or a silicon nitride, when an oxidizing process is performed, only the sacrificial layer 120 is oxidized to form the first layer 142b on the sidewall of the sacrificial layer 120. Here, a thickness of the first layer 142b may be adjusted by adjusting a process time.

In an example embodiment, in a case in which the spacers 156 are formed of an oxidized material, the first layer 142b may also be formed on the sidewalls of the spaces 156 exposed through the first opening OP1.

Figure 33:
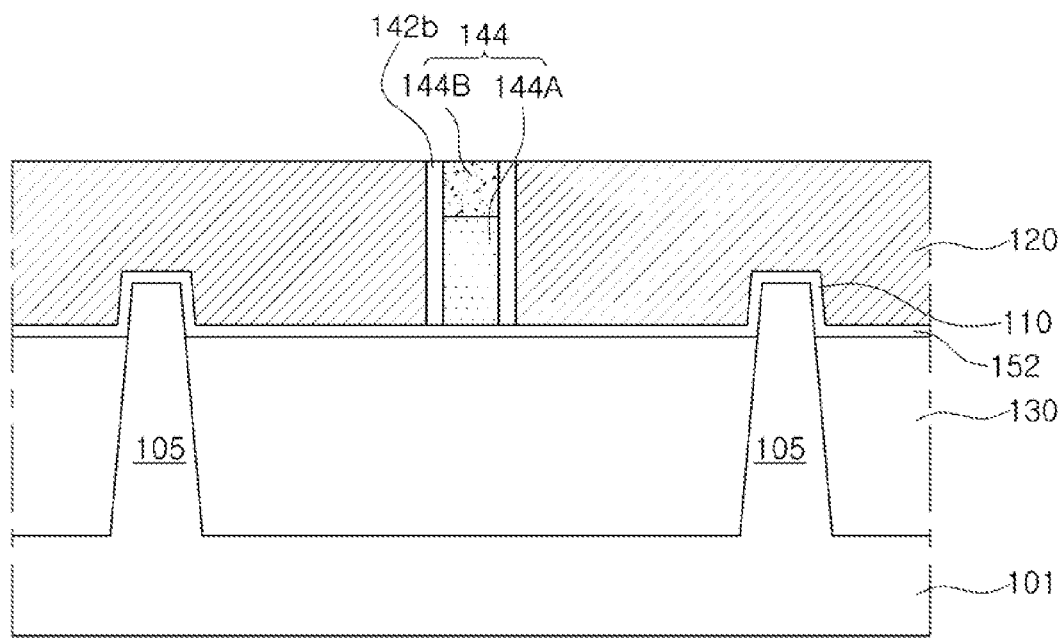

Referring to FIG. 33, the second layer 144 of the gate isolation portion 140 filling the first opening OP1 may be formed. The second layer 144 may include the lower layer 144A and the upper layer 144B.

The lower layer 144A may be formed by adjusting a material and/or process conditions such that a material may be deposited from a lower portion of the first opening OP1. For example, the lower layer 144A may be formed of a silicon nitride SiN, but the present inventive concept is not limited thereto. A height of the lower layer 144A may be equal to or greater than a half of a height of the sacrificial layer 120.

The upper layer 144B may be formed of a material different from that of the lower layer 144A. For example, the upper layer 144B may be formed of a silicon dioxide ($SiO_2$), but a material of the upper layer 144B is not limited thereto.

In an example embodiment, the second layer 144 may be formed as a monolayer.

Figure 34:
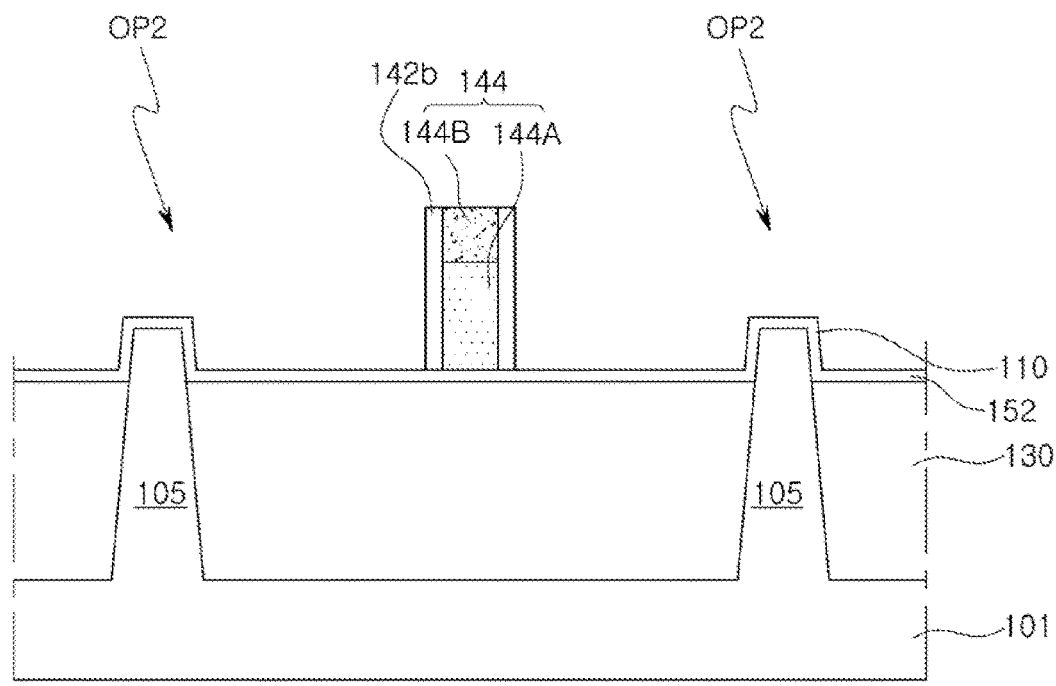

Referring to FIG. 34, the sacrificial layer 120 remained on both side surfaces of the second layer 144 may be removed.

The sacrificial layer 120 may be selectively removed with respect to the first layer 142b, the spacers 156, and the gate insulating layer 152 to expose the gate insulating layer 152 therebelow, and accordingly, the second opening OP2 may be formed.

As the process of removing the sacrificial layer 120, at least one of a dry etching process and a wet etching process may be used. For example, the sacrificial layer 120 may be removed by performing a dry etching process first, and subsequently performing a wet etching process.

Figure 35:
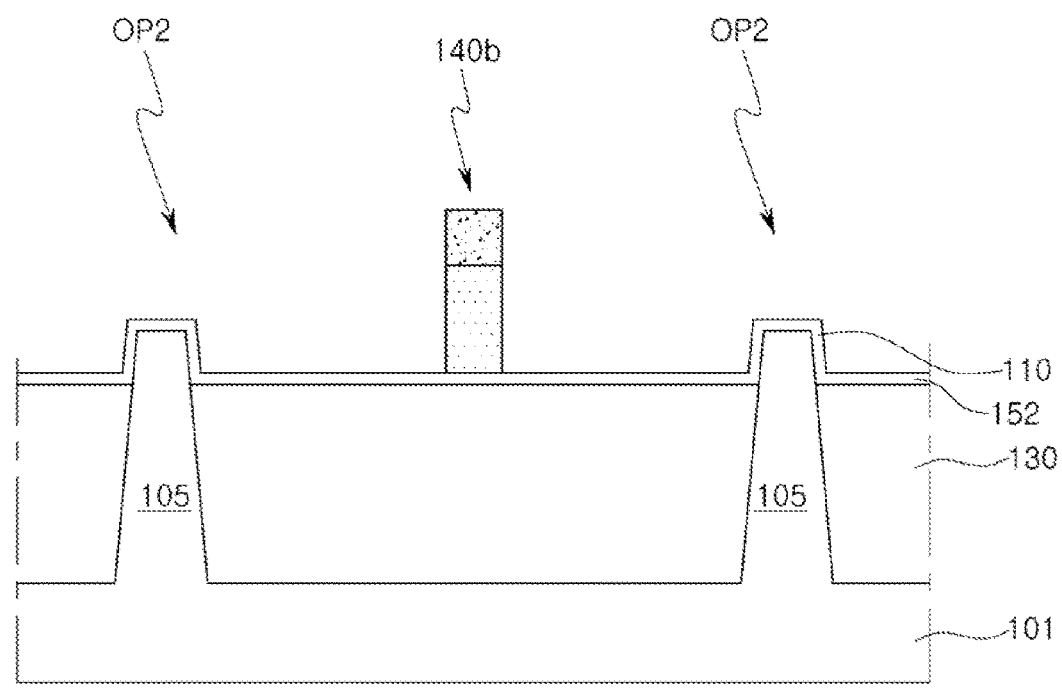

Referring to FIG. 35, the first layer 142b may be exposed through the second opening OP2 may be removed.

As the process of removing the first layer 142b, a wet etching process may be used, for example. In this case, the first layer 142b may be selectively etched with respect to the second layer 144, and the gate isolation portion 140b may be formed only with the second layer 144. Through this process, the second opening OP2 may extend toward the second layer 144.

In an example embodiment, a portion of the first layer 142b may be remained to form a portion of the gate isolation portion 140b.

Figure 36:
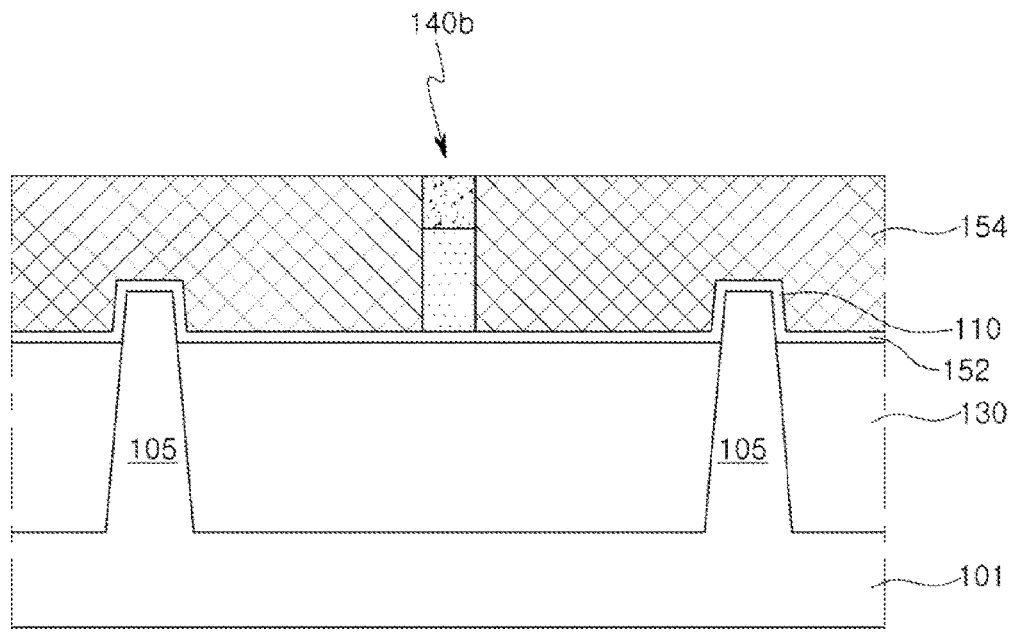

Referring to FIG. 36, a process of forming the gate electrodes 154 in the second opening OP2 may be performed. Accordingly, the gate structure 150 including the gate insulating layer 152, the gate electrodes 154, and the spacers 156 may be formed.

The gate electrodes 154 may be formed by depositing a material forming the gate electrodes 154 within the second opening OP2 and performing a planarization process. As illustrated, the adjacent gate electrodes 154 which are arranged in a row in a direction crossing the active region 105 may be separated by the gate isolation portion 140b. In one embodiment, the gate electrodes 154 may be made of, for example, a polysilicon or a metal.

Figure 37:
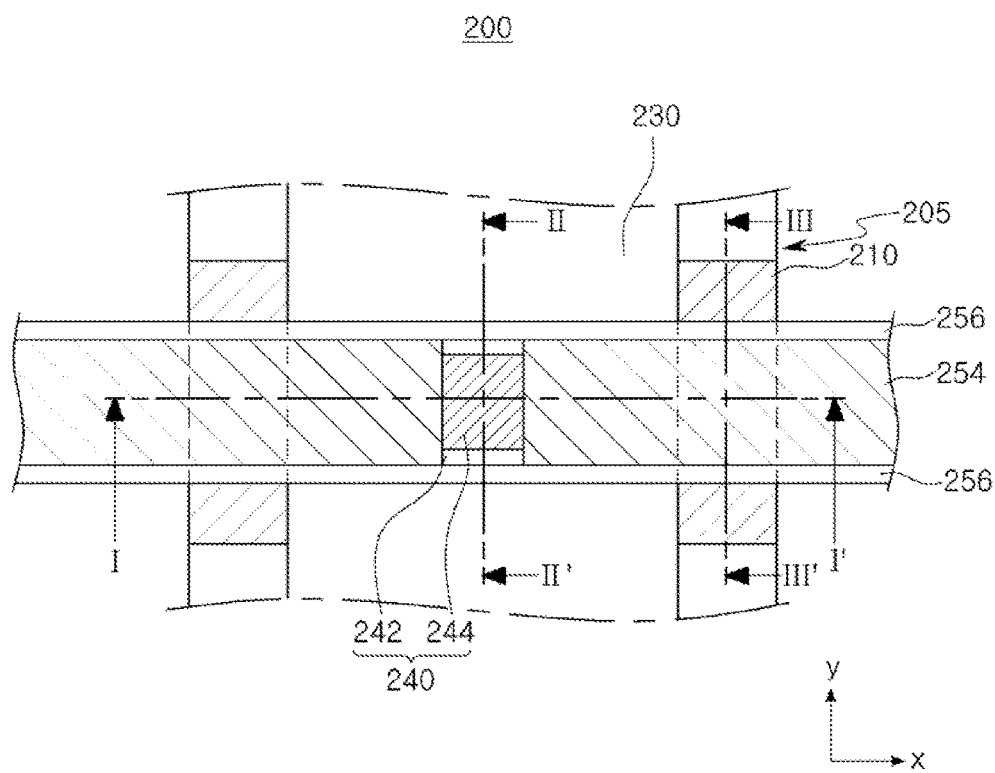
FIGS. 37, 38A, 38B, and 38C are a plan view and cross-sectional views illustrating a semiconductor device that can be realized by applying the method for forming a pattern of a semiconductor device according to example embodiments of the present inventive concept.
Figure 38A:
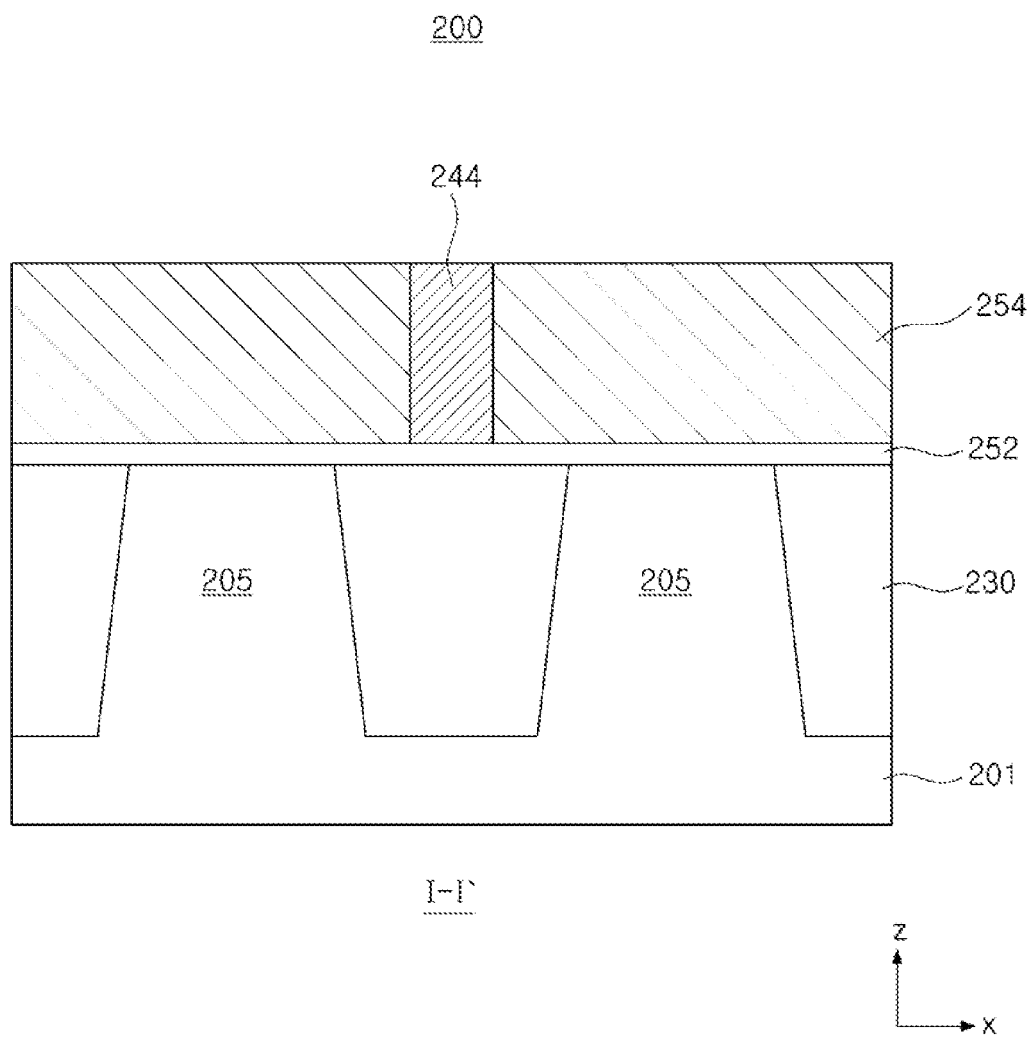
Figure 38B:
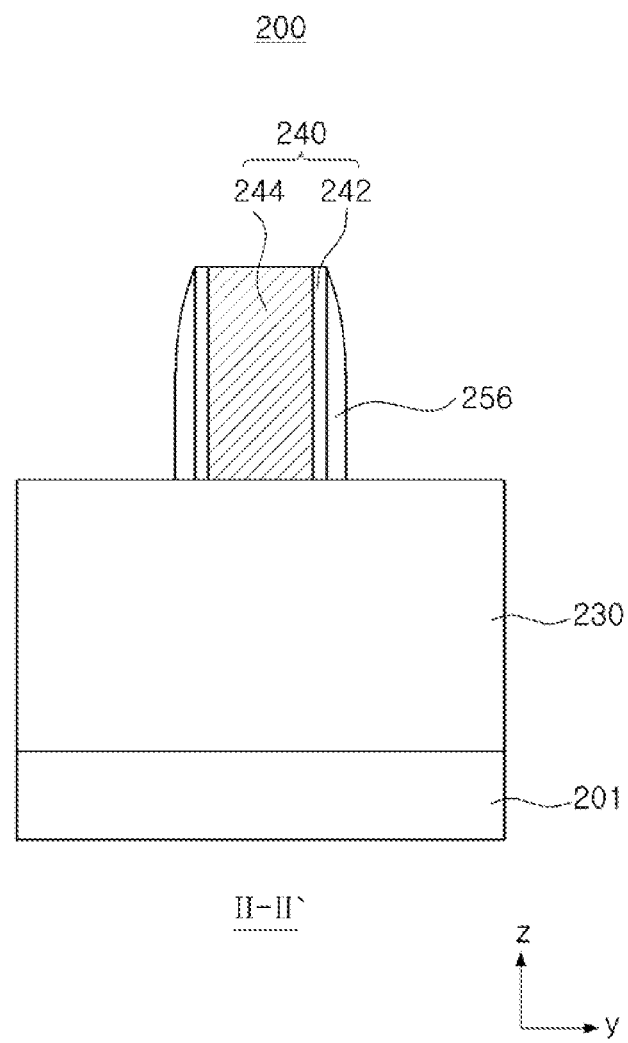
Figure 38C:
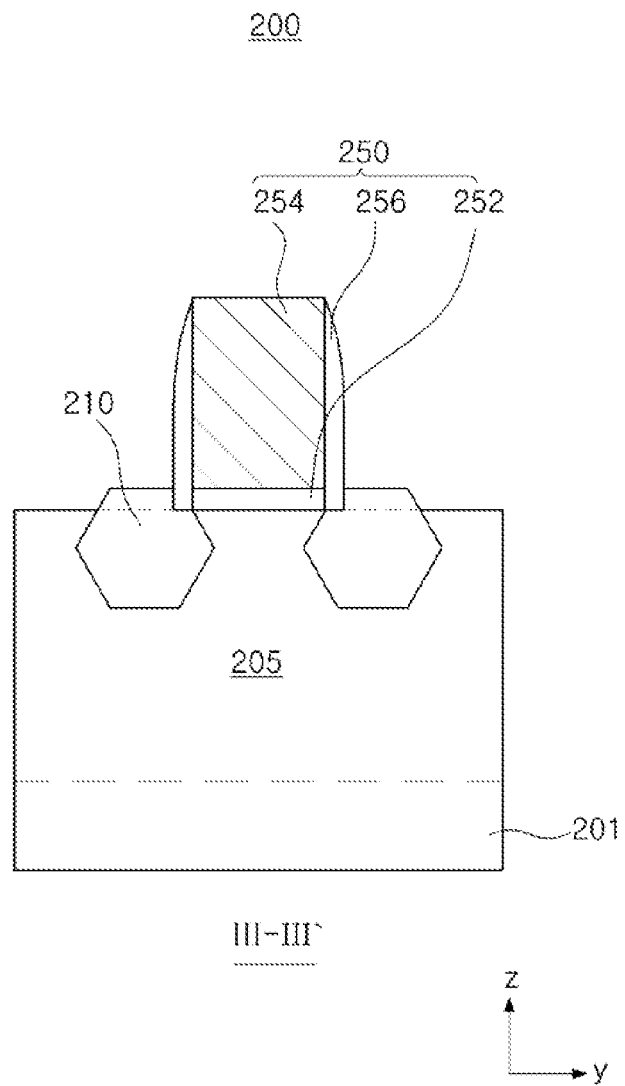

FIGS. 37 through 38C are a plan view and cross-sectional views illustrating a semiconductor device that can be realized by applying the method for forming a pattern of a semiconductor device according to example embodiments of the present inventive concept. FIGS. 38A through 38C are cross-sectional views taken along lines I-I', II-II', and III-III' of FIG. 37.

Referring to FIGS. 37 through 38C, a semiconductor device 200 may include a substrate 201, active regions 205 extending in a first direction, for example, in the y direction, in the substrate 201, and a gate structure 250 including gate electrodes 254 extending in a second direction, for example, in the x direction, on the active regions 205, and a gate isolation portion 240 disposed between the gate electrodes 254 arranged in a row in the x direction. Also, the semiconductor device 200 may further include isolation layers 230 defining the active regions 205 and epitaxial layers 210 positioned on the active regions 205 on the sides of the gate electrodes 254.

Unlike the semiconductor device 100 of FIGS. 10A through 11, the semiconductor device 200 according to the present example embodiment may be a planar transistor in which the active regions 205 do not protrude toward the gate electrodes 254 and have a flat upper surface.

The substrate 201 may have an upper surface extending in the x direction and the y direction. The substrate 201 may include a semiconductor material, for example, Group IV semiconductor, Group III-V compound semiconductor, or Group II-VI oxide semiconductor.

The isolation layers 230 may be formed of an insulating material. The isolation layers 230 may be an oxide, a nitride, or a combination thereof, for example. The active regions 205 may be defined by the isolation layers 230 within the substrate 201. The active regions 205 may be recessed on the sides of the gate electrodes 254, and epitaxial layers 210 may be disposed therein. The epitaxial layers 210 may be provided as source and drain regions of transistors. In an example embodiment, the semiconductor device 200 may not include the epitaxial layer 210 and the source and drain electrodes may be formed as impurity regions within the active regions 205.

The gate structure 250 may include a gate insulating layer 252 disposed between the gate electrode 254 and the active regions 205, the gate electrode 254, and spacers 256 disposed on the side surfaces of the gate electrodes 254. The gate insulating layer 252 may be formed of an oxide, a nitride, or an oxynitride. The gate electrode 254 may be disposed to intersect the active regions 205 above the active regions 205, and a single gate electrode 254 may form a single transistor. Channel regions of a transistor may be formed in the active regions 205 intersecting the gate electrode 254. The gate electrode 254 may include a metal, a metal nitride, or doped polysilicon. The spacers 256 may be formed on both side surfaces of the gate electrodes 254. The spacers 256 may be formed of an oxide, a nitride, and an oxynitride, and may be formed as a multi-layer.

The gate isolation portion 240 may be disposed on the substrate 201 such that the gate electrodes 254 extending in the x direction are cut to a predetermined length.

The gate isolation portion 240 may include first and second layers 242 and 244. The first layer 242 may be disposed on both side surfaces of the second layer 244 in the y direction. The first and second layers 242 and 244 may be formed of materials each having an etch selectivity with respect to each other, but the present inventive concept is not limited thereto. The first and second layers 242 and 244 may be formed of at least one among a silicon-contained material such as a silicon dioxide ($SiO_2$), a silicon oxynitride (SiON), a silicon nitride ($Si_3N_4$), and polysilicon, or a metal.

Figure 39:
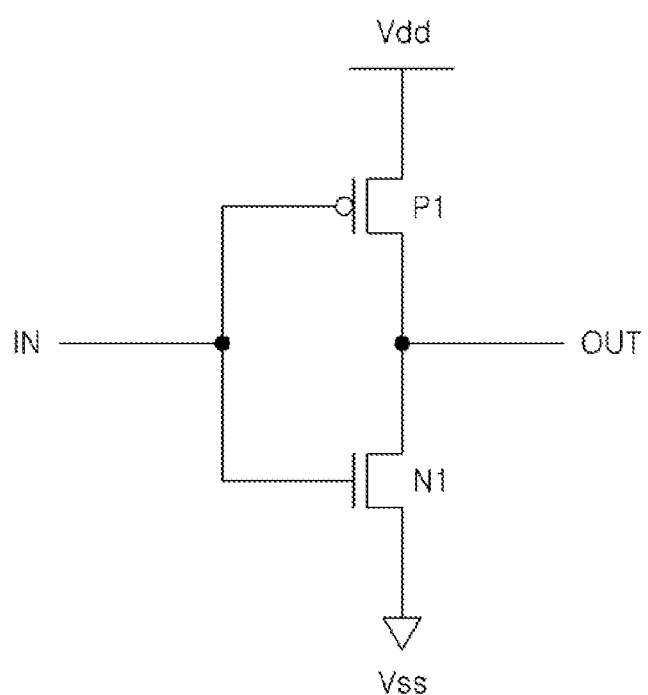
FIG. 39 is a circuit diagram of a CMOS inverter including a semiconductor device according to example embodiments of the present inventive concept.

FIG. 39 is a circuit diagram of a CMOS inverter including a semiconductor device according to an example embodiment of the present inventive concept.

Referring to FIG. 39, the CMOS inverter may include a PMOS transistor P1 and an NMOS transistor N1. At least one of the PMOS transistor P1 and the NMOS transistor N1 may include at least one of the semiconductor devices according to the various example embodiments of the present inventive concept described above with reference to FIGS. 1, 10A through 11, 30, 31, 37, and 38A through 38C.

The PMOS and NMOS transistors may be connected in series between a source voltage line Vdd and a ground voltage line Vss, and an input signal IN may be commonly input to gates of the PMOS and NMOS transistors. Also, an output signal OUT may be commonly output from drains of the PMOS and NMOS transistors. A power supply voltage may be applied to a source of the PMOS transistor, and a ground voltage may be applied to a source of the NMOS transistor. The CMOS inverter may invert the input signal IN and output the inverted signal as an output signal OUT. For example, when a logic level "1" is input as an input signal of the inverter, a logic level "0" may be output as an output signal, and when a logic level "0" is input as an input signal of the inverter, a logic level "1" may be output as an output signal.

Figure 40:
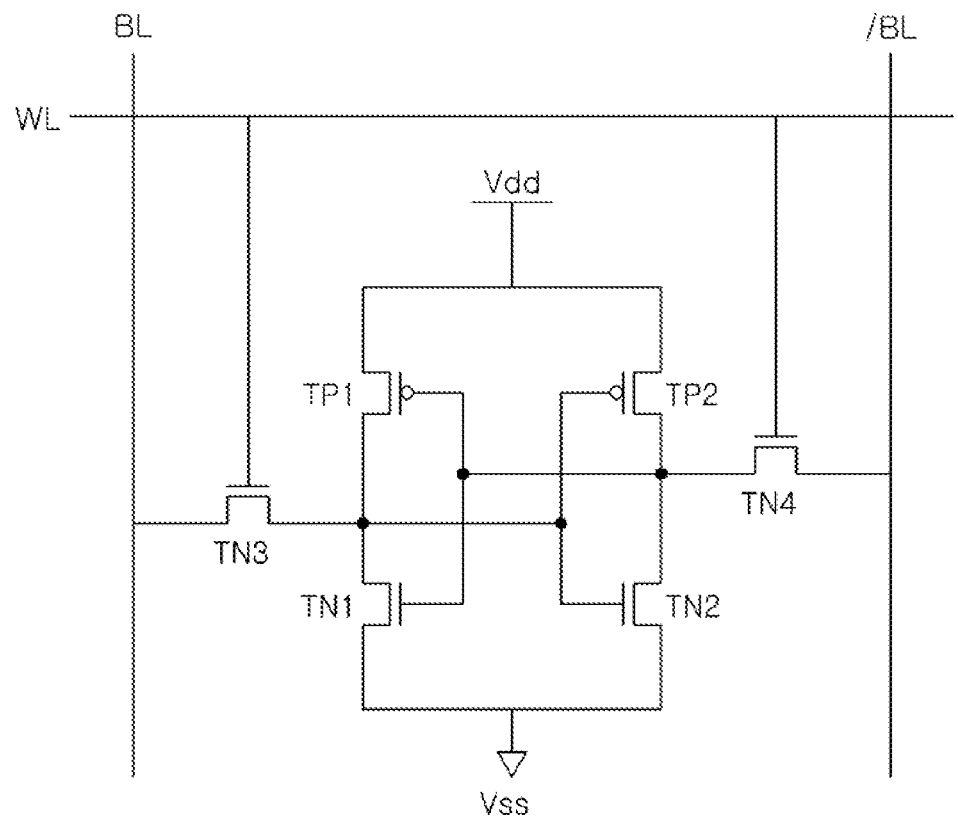
FIG. 40 is a circuit diagram of a SRAM cell including a semiconductor device according to example embodiments of the present inventive concept.

FIG. 40 is a circuit diagram of an SRAM cell including a semiconductor device according to an example embodiment of the present inventive concept.

Referring to FIG. 40, in an SRAM device, one cell may include first and second driving transistors TN1 and TN2, first and second load transistors TP1 and TP2, and first and second access transistors TN3 and TN4. Here, sources of the first and second driving transistors TN1 and TN2 may be connected to a ground voltage line Vss, and sources of the first and second load transistors TP1 and TP2 may be connected to a source voltage line Vdd.

The first driving transistor TN1 configured as an NMOS transistor and the first load transistor TP1 configured as a PMOS transistor may form a first inverter, and the second driving transistor TN2 configured as an NMOS transistor and the second load transistor TP2 configured as a PMOS transistor may form a second inverter. At least one of the first and second driving transistors TN1 and TN2, the first and second load transistors TP1 and TP2, and the first and second access transistors TN3 and TN4 may include the semiconductor devices according to various example embodiments of the present inventive concept described above with reference to FIGS. 1, 10A through 11, 30, 31, 37, and 38A through 38C.

Output terminals of the first and second inverters may be connected to sources of the first access transistor TN3 and the second access transistor TN4. Also, in order to configure a single latch circuit, input terminals and output terminals of the first and second inverters may be connected in a crossing manner. Drains of the first and second access transistors TN3 and TN4 may be connected to first and second bit lines BL and /BL, respectively.

Figure 41:
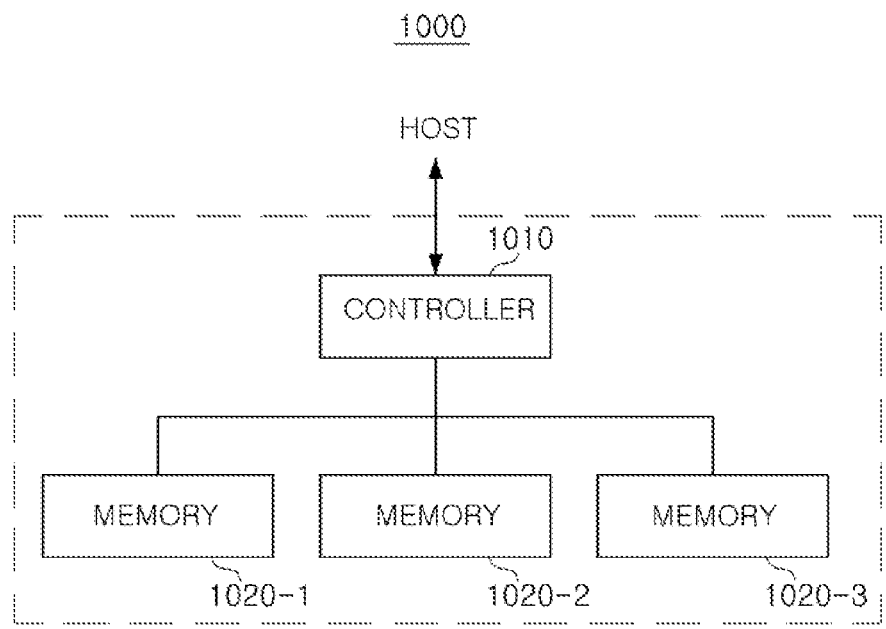
FIG. 41 is a block diagram illustrating a storage device including a semiconductor device according to example embodiments of the present inventive concept.

FIG. 41 is a block diagram illustrating a storage device including semiconductor devices according to example embodiments of the present inventive concept.

Referring to FIG. 41, a storage device 1000 according to the present example embodiment may include a controller 1010 communicating with a host HOST and memories 1020-1, 1020-2, and 1020-3 storing data. At least one of the memories 1020-1, 1020-2, and 1020-3 may include at least one of the semiconductor devices according to various example embodiments of the present inventive concept described above with reference to FIGS. 1, 10A through 11, 30, 31, 37, and 38A through 38C.

The host HOST communicating with the controller 1010 may be various electronic devices in which the storage device 1000 is installed. For example, the host HOST may be a smartphone, a digital camera, a desktop computer, a laptop computer, a media player, and the like. The controller 1010 may receive a data write or read request delivered from the host HOST and store data in the memories 1020-1, 1020-2, and 1020-3, or may generate a command CMD for retrieving data from the memories 1020-1, 1020-2, and 1020-3.

As illustrated in FIG. 41, one or more memories 1020-1, 1020-2, and 1020-3 may be connected to the controller 1010 in parallel within the storage device 1000. The storage device 1000 having high capacity such as a solid state drive (SSD) may be realized by connecting the plurality of memories 1020-1, 1020-2, and 1020-3 to the controller 1010 in parallel.

Figure 42:
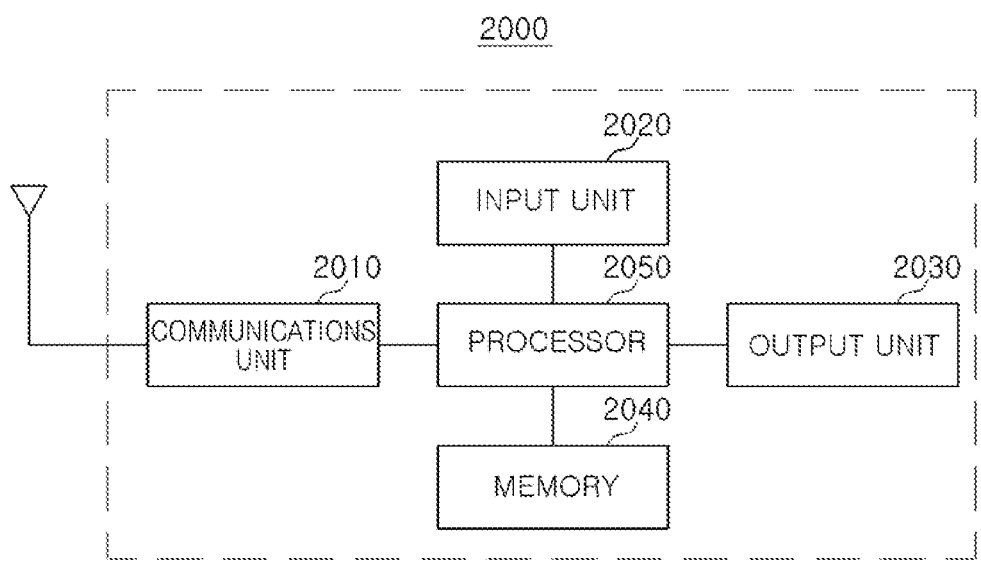
FIG. 42 is a block diagram illustrating an electronic device including a semiconductor device according to example embodiments of the present inventive concept.

FIG. 42 is a block diagram illustrating an electronic device including at least one of the semiconductor devices according to example embodiments of the present inventive concept.

Referring to FIG. 42, an electronic device 2000 according to the present example embodiment may include a communications unit 2010, an input unit 2020, an output unit 2030, a memory 2040, and a processor 2050.

The communications unit 2010 may include a wired/wireless communications module, and may include a wireless Internet module, a short-range communications module, a global positioning system (GPS) module, a mobile communications module, and the like. The wired/wireless communications module included in the communications unit 2010 may be connected to an external communications network according to various standards to transmit and receive data.

The input unit 2020, a module provided for a user to control an operation of the electronic device 2000, may include a mechanical switch, a touch screen, a voice recognition module, and the like. Also, the input unit 2020 may include a track ball, a mouse operating in a laser pointer manner, or a finger mouse device, and may further include various sensor modules allowing a user to input data.

The output unit 2030 may output information processed in the electronic device 2000 in the form of voice or an image, and the memory 2040 may store a program for processing and controlling the processor 2050, or data. The processor 2050 may transmit a command to the memory 2040 according to a required operation to store or retrieve data.

The memory 2040 may communicate with the processor 2050 through an interface installed in the electronic device 2000 or a separate interface. When the memory 2040 communicates with the processor 2050 through a separate interface, the processor 2050 may store data in or retrieve data from the memory 2040 through various interface standards such as a secure digital (SD), a secure digital high-capacity (SDHC), a secure digital extended capacity (SDXC), micro-SC, universal serial bus (USB), and the like.

The processor 2050 controls operations of each component included in the electronic device 2000. The processor 2050 may perform controlling and processing related to a voice, call, a video call, data communications, and the like, or may perform controlling and processing to play and manage multimedia. Also, the processor 2050 may process an input transmitted from the user through the input unit 2020 and output a corresponding result through the output unit 2030. Also, as mentioned above, the processor 2050 may store data required for controlling an operation of the electronic device 2000 in the memory 2040 or may retrieve such data from the memory 2040. At least one of the processor 2050 and the memory 2040 may include at least one of the semiconductor devices according to various example embodiments described above with reference to FIGS. 1, 10A through 11, 30, 31, 37, and 38A to 38C.

Figure 43:
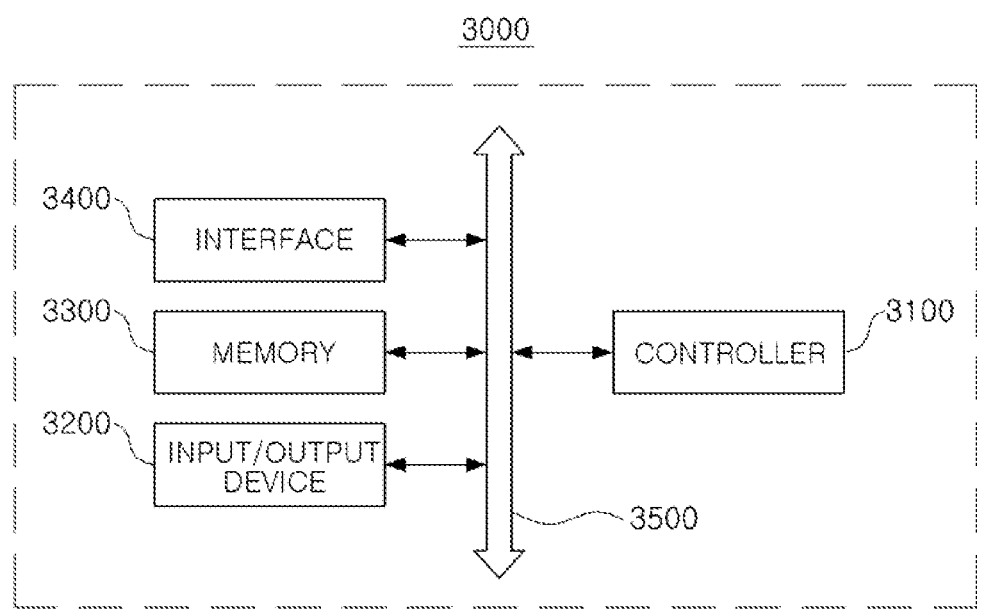
FIG. 43 is a schematic view illustrating a system including a semiconductor device according to example embodiments of the present inventive concept.

FIG. 43 is a schematic view illustrating a system including at least one of the semiconductor devices according to example embodiments of the present inventive concept.

Referring to FIG. 43, a system 3000 may include a controller 3100, an input/output device 3200, a memory 3300, and an interface 3400. The system 3000 may be a mobile system or a system transmitting or receiving information. The mobile system may be a personal digital assistant (PDA), a portable computer, a Web tablet, a wireless phone, a mobile phone, a digital music player, or a memory card.

The controller 3100 may serve to execute a program or control the system 3000. The controller 3100 may be a microprocessor, a digital signal processor (DSP), a microcontroller, or a device similar thereto.

The input/output device 3200 may be used to input or output data of the system 3000. The system 3000 may be connected to an external device, for example, a personal computer or a network, using an input/output device 3200 and exchange data with the external device. The input/output device 3200 may be, for example, a keypad, a keyboard, or a display.

The memory 3300 may store a code and/or data for operation of the controller 3100 and/or store data processed in the controller 3100. The memory 3300 may include at least one of the semiconductor devices according to any one of the example embodiments of the present inventive concept.

The interface 3400 may be a data transmission passage between the system 3000 and other external device. The controller 3100, the input/output device 3200, the memory 3300, and the interface 3400 may communicate with each other through a bus 3500.

The controller 3100 or the memory 3300 may include the semiconductor devices according to various example embodiments described above with reference to FIGS. 1, 10A through 11, 30, 31, 37, and 38A to 38C.

As set forth above, according to example embodiments of the present inventive concept, the semiconductor device having enhanced integration through the use of the pattern isolation portion, the method for forming a pattern of the semiconductor device, and the method for manufacturing the semiconductor device may be provided.

While example embodiments have been shown and described above, it will be apparent to those skilled in the art that modifications and variations could be made without departing from the scope of the present inventive concept as defined by the appended claims.

What is claimed is:

1. A method for manufacturing a semiconductor device, the method comprising:
    forming a structure including a sacrificial pattern layer on a substrate, the sacrificial pattern layer having a line shape extending in a first direction and including first and second parts;
    forming a mask layer exposing the first part of the sacrificial pattern layer;
    removing the first part of the sacrificial pattern layer exposed by the mask layer to form an opening in the structure;
    forming a first layer of a pattern isolation portion covering at least a portion of an inner wall of the opening including a side surface of the second part exposed through the opening;
    forming a second layer of the pattern isolation portion filling the opening;
    removing the second part of the sacrificial pattern layer;
    removing at least a portion of the first layer exposed by removing the second part of the sacrificial pattern layer; and
    forming a conductive pattern layer in a region formed by removing the second part of the sacrificial pattern layer and the portion of the first layer.

2. The method of claim 1, wherein the first and second parts of the sacrificial pattern layer are alternately disposed in the first direction, and the sacrificial pattern layer is cut by removing the first part of the sacrificial pattern layer.

3. The method of claim 1, wherein the conductive pattern layer extends in the first direction and includes patterns disposed to be spaced apart from one another in the first direction.

4. The method of claim 1, wherein, in the forming the first layer, the first layer is formed on the entirety of an inner sidewall of the opening.

5. The method of claim 4, wherein the first layer is formed by atomic layer deposition (ALD).

6. The method of claim 1, wherein, in the forming the first layer, the first layer is formed only on side surfaces of the second part of the sacrificial pattern layer exposed by the opening.

7. The method of claim 6, wherein, in the forming the first layer, the first layer is formed by oxidizing a portion of the second part of the sacrificial pattern layer.

8. The method of claim 1, wherein, in the removing of at least the portion of the first layer, the first layer is selectively removed with respect to the second layer.

9. The method of claim 1, wherein the second layer includes an upper layer and a lower layer formed of different materials.

10. A method for manufacturing a semiconductor device, the method comprising:
    forming a linear sacrificial pattern layer extending in a first direction on a substrate;
    removing a first part of the sacrificial pattern layer to form a first single opening;
    filling the first single opening to form a pattern isolation portion, the pattern isolation portion fully covering a bottom of the single opening;
    removing a second part of the sacrificial pattern layer that includes the remaining sacrificial pattern layer, the second part of the sacrificial pattern layer disposed at opposite sides of the first single opening in the first direction; and
    forming conductive pattern layers extending in the first direction on both sides of the pattern isolation portion.

11. The method of claim 10, wherein the pattern isolation portion includes two layers formed of different respective materials.

12. The method of claim 11, wherein the forming of the pattern isolation portion comprises:
    forming a first layer on side surfaces of the sacrificial layer exposed by the first single opening; and
    forming a second layer filling the first single opening.

13. The method of claim 12, further comprising:
    removing at least a portion of the first layer exposed by removing the second part of the sacrificial pattern layer, before the forming of the conductive pattern layers.

14. The method of claim 12, wherein the first layer is formed by atomic layer deposition (ALD) or oxidizing a portion of the sacrificial pattern layer in the first single opening.

15. A method for manufacturing a semiconductor device, the method comprising:
    forming a sacrificial layer extending in a first direction on a first insulating layer;
    removing a first part of the sacrificial layer to form an opening region;
    forming a first layer to cover at least entire sidewall surfaces of the sacrificial layer in the opening region to fill a first portion of the opening region;
    forming a second layer filling a second portion of the opening region to form an isolation portion;

removing a second part of the sacrificial layer that includes the remaining sacrificial layer;

after removing the second part of the sacrificial layer, removing at least a first portion of the first layer; and forming a third layer on the removed portion of the sacrificial layer and the removed first portion of the first layer, the third layer extending in the first direction on both sides of the isolation portion.

16. The method of claim 15, further comprising:

forming an insulating layer on side surfaces of the sacrificial layer, the insulating layer extending in the first direction and adjacent to the sacrificial layer in a second direction perpendicular the first direction, wherein the sacrificial layer includes a material having an etch selectivity with respect to those of the first and second layers.

17. The method of claim 15, further comprising:

before forming the sacrificial layer, forming an isolation layer defining a plurality of active regions on a substrate, wherein the sacrificial layer intersects the plurality of active regions in the first direction, and wherein a source and a drain of a transistor are formed in a region of the plurality of active regions, and a gate of the transistor corresponds to a potion of the third layer.

18. The method of claim 15, wherein a length of the opening region in the first direction is greater than a length of the isolation portion in the first direction.

19. The method of claim 15, wherein the first layer and the second layer include different materials each having an etch selectivity with respect to each other.

20. The method of claim 15, wherein the first layer is formed by atomic layer deposition (ALD) or oxidizing a portion of the sacrificial layer in the opening region.

* * * * *